(12) United States Patent
Sekar et al.

(10) Patent No.: US 7,606,071 B2
(45) Date of Patent: Oct. 20, 2009

(54) COMPENSATING SOURCE VOLTAGE DROP IN NON-VOLATILE STORAGE

(75) Inventors: Deepak Chandra Sekar, Atlanta, GA (US); Nima Mokhlesi, Los Gatos, CA (US); Hao Thai Nguyen, San Jose, CA (US); Seungpil Lee, San Ramon, CA (US); Man Lung Mui, Santa Clara, CA (US)

(73) Assignee: SanDisk Corporation, Milpitas, CA (US)

( * ) Notice: Subject to any disclaimer, the term of this patent is extended or adjusted under 35 U.S.C. 154(b) by 105 days.

(21) Appl. No.: 11/739,501

(22) Filed: Apr. 24, 2007

(65) Prior Publication Data

US 2008/0266963 A1 Oct. 30, 2008

(51) Int. Cl.
*G11C 16/06* (2006.01)

(52) U.S. Cl. .................. 365/185.17; 365/185.18; 365/185.22

(58) Field of Classification Search ............ 365/185.17, 365/185.18, 185.19, 185.22
See application file for complete search history.

(56) References Cited

U.S. PATENT DOCUMENTS

| 5,386,422 | A | 1/1995 | Endoh |
|---|---|---|---|
| 5,467,306 | A | 11/1995 | Kaya |
| 5,522,580 | A | 6/1996 | Varner, Jr. |
| 5,570,315 | A | 10/1996 | Tanaka |
| 5,774,397 | A | 6/1998 | Endoh |
| 5,838,626 | A | 11/1998 | Nakayama |
| 5,923,585 | A | 7/1999 | Wong |
| 6,046,935 | A | 4/2000 | Takeuchi |
| 6,118,702 | A | 9/2000 | Shieh |
| 6,125,052 | A | 9/2000 | Tanaka |
| 6,166,951 | A | 12/2000 | Derhocobian |
| 6,175,522 | B1 | 1/2001 | Fang |
| 6,218,895 | B1 | 4/2001 | De |
| 6,222,762 | B1 | 4/2001 | Guterman |
| 6,272,666 | B1 | 8/2001 | Borkar |
| 6,301,155 | B1 | 10/2001 | Fujiwara |
| 6,456,528 | B1 | 9/2002 | Chen |

(Continued)

OTHER PUBLICATIONS

Sekar, et al., U.S. Appl. No. 11/618,782, filed Dec. 30, 2006, titled Biasing Non-Volatile Storage to Compensate for Temperature Variations.

(Continued)

*Primary Examiner*—Tuan T Nguyen
*Assistant Examiner*—Hien N Nguyen
(74) *Attorney, Agent, or Firm*—Vierra Magen Marcus & DeNiro LLP

(57) ABSTRACT

A source line bias error caused by a voltage drop in a source line of a non-volatile memory device during a read or verify operation is addressed. In one approach, a body bias is applied to a substrate of the non-volatile memory device by coupling the substrate to a source voltage or a voltage which is a function of the source voltage. In another approach, a control gate voltage and/or drain voltage, e.g., bit line voltage, are compensated by referencing them to a voltage which is based on the source voltage instead of to ground. Various combinations of these approaches can be used as well. During other operations, such as programming, erase-verify and sensing of negative threshold voltages, the source line bias error is not present, so there is no need for a bias or compensation. A forward body bias can also be compensated.

24 Claims, 22 Drawing Sheets

U.S. PATENT DOCUMENTS

| | | | |
|---|---|---|---|
| 6,484,265 | B2 | 11/2002 | Borkar |
| 6,522,580 | B2 | 2/2003 | Chen |
| 6,560,152 | B1 | 5/2003 | Cernea |
| 6,608,781 | B1 * | 8/2003 | Jinbo et al. ............ 365/189.09 |
| 6,653,890 | B2 | 11/2003 | Ono |
| 6,734,490 | B2 | 5/2004 | Esseni |
| 6,771,536 | B2 | 8/2004 | Li |
| 6,801,454 | B2 | 10/2004 | Wang |
| 6,822,905 | B2 | 11/2004 | Micheloni |
| 6,839,281 | B2 | 1/2005 | Chen |
| 6,859,397 | B2 | 2/2005 | Lutze |
| 6,870,213 | B2 | 3/2005 | Cai |
| 6,882,567 | B1 | 4/2005 | Wong |
| 6,900,650 | B1 | 5/2005 | Sheng |
| 6,917,237 | B1 | 7/2005 | Tschanz |
| 6,957,163 | B2 | 10/2005 | Ando |
| 7,023,736 | B2 | 4/2006 | Cernea |
| 7,046,568 | B2 | 5/2006 | Cernea |
| 7,057,958 | B2 | 6/2006 | So |
| 7,116,588 | B2 | 10/2006 | Joo |
| 7,129,771 | B1 | 10/2006 | Chen |
| 7,173,854 | B2 | 2/2007 | Cernea |
| 7,196,928 | B2 | 3/2007 | Chen |
| 7,196,931 | B2 | 3/2007 | Cernea |
| 7,206,230 | B2 | 4/2007 | Li |
| 7,334,080 | B2 | 2/2008 | Takase |
| 7,468,920 | B2 * | 12/2008 | Sekar et al. ............ 365/185.27 |
| 7,508,713 | B2 * | 3/2009 | Sekar et al. ............ 365/185.18 |
| 7,525,843 | B2 * | 4/2009 | Sekar et al. ............ 365/185.18 |
| 2002/0140496 | A1 | 10/2002 | Keshavarzi |
| 2004/0057287 | A1 | 3/2004 | Cernea |
| 2004/0109357 | A1 | 6/2004 | Cernea |
| 2004/0255090 | A1 | 12/2004 | Guterman |
| 2005/0024939 | A1 | 2/2005 | Chen |
| 2005/0052219 | A1 | 3/2005 | Butler |
| 2005/0111260 | A1 | 5/2005 | Nazarian |
| 2005/0192773 | A1 | 9/2005 | Sheng |
| 2006/0050562 | A1 | 3/2006 | Cernea |
| 2006/0126390 | A1 | 6/2006 | Gorobets |
| 2006/0140007 | A1 | 6/2006 | Cernea |
| 2006/0158947 | A1 | 7/2006 | Chan |
| 2006/0203545 | A1 | 9/2006 | Cernea |
| 2006/0226889 | A1 | 10/2006 | Gupta |
| 2006/0227613 | A1 | 10/2006 | Joo |

OTHER PUBLICATIONS

Sekar, et al., U.S. Appl. No. 11/618,786, filed Dec. 30, 2006, titled Non-Volatile Storage With Bias for Temperature Compensation.

Sekar, et al., U.S. Appl. No. 11/618,788, filed Dec. 30, 2006, titled Biasing Non-Volatile Storage Based on Selected Word Line.

Sekar, et al., U.S. Appl. No. 11/618,790, filed Dec. 30, 2006, titled Non-Volatile Storage With Bias Based On Selected Word Line.

Sekar, et al., U.S. Appl. No. 11/618,791, filed Dec. 30, 2006, titled Applying Adaptive Body Bias to Non-Volatile Storage.

Sekar, et al., U.S. Appl. No. 11/618,793, filed Dec. 30, 2006, titled Non-Volatile Storage With Adaptive Body Bias.

N. Shibata et al., A 70nm 16Gb 16-level-cell NAND Flash Memory, 2007 Symp. on VLSI Circuits Digest of Technical Papers, pp. 190-191, Jun. 14-16, 2007.

Y. Zhang et al., An Integrated Phase Change Memory Cell With Ge Nanowire Diode For Cross-Point Memory, 2007 Symp. on VLSI Circuits Digest of Technical Papers, pp. 98-99, Jun. 14-16, 2007.

D.H. Kang et al., Novel Heat Dissipating Cell Scheme For Improving A Reset Distribution In A 512M Phase-Change Random Access Memory (PRAM), 2007 Symp. on VLSI Circuits Digest of Technical Papers, pp. 96-97, Jun. 14-16, 2007.

H. Tanaka et al., Bit Cost Scalable Technology With Punch And Plug Process For Ultra High Density Flash Memory, 2007 Symp. on VLSI Circuits Digest of Technical Papers, pp. 14-15, Jun. 14-16, 2007.

U.S. Appl. No., 11/739,509, filed Apr. 24, 2007.

Response to Office Action dated Jun. 24, 2009, U.S. Appl. No. 11/739,509, filed Apr. 24, 2007.

Office Action dated Jun. 10, 2009, U.S. Appl. No. 11/739,509, filed Apr. 24, 2007.

* cited by examiner

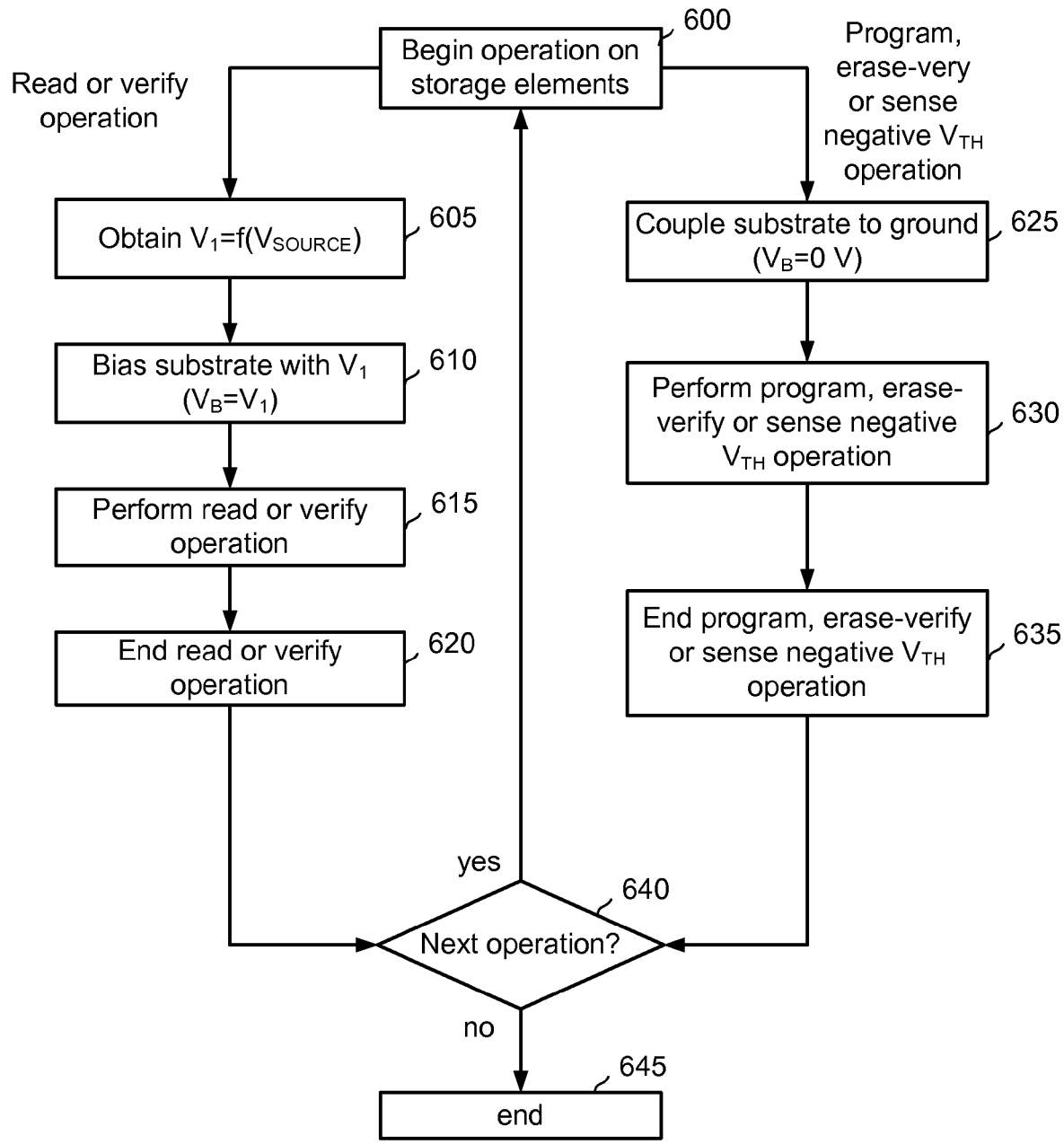

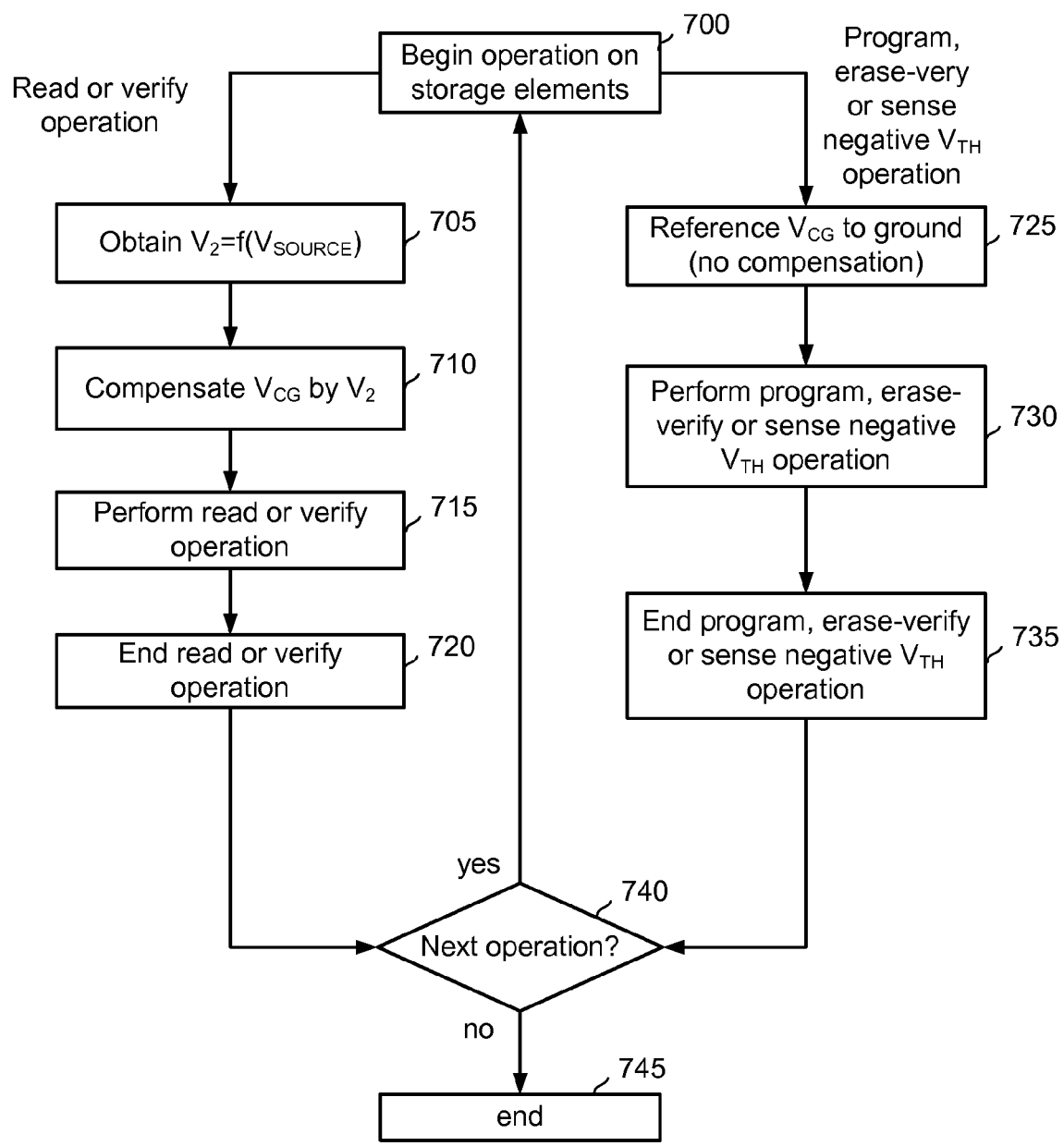

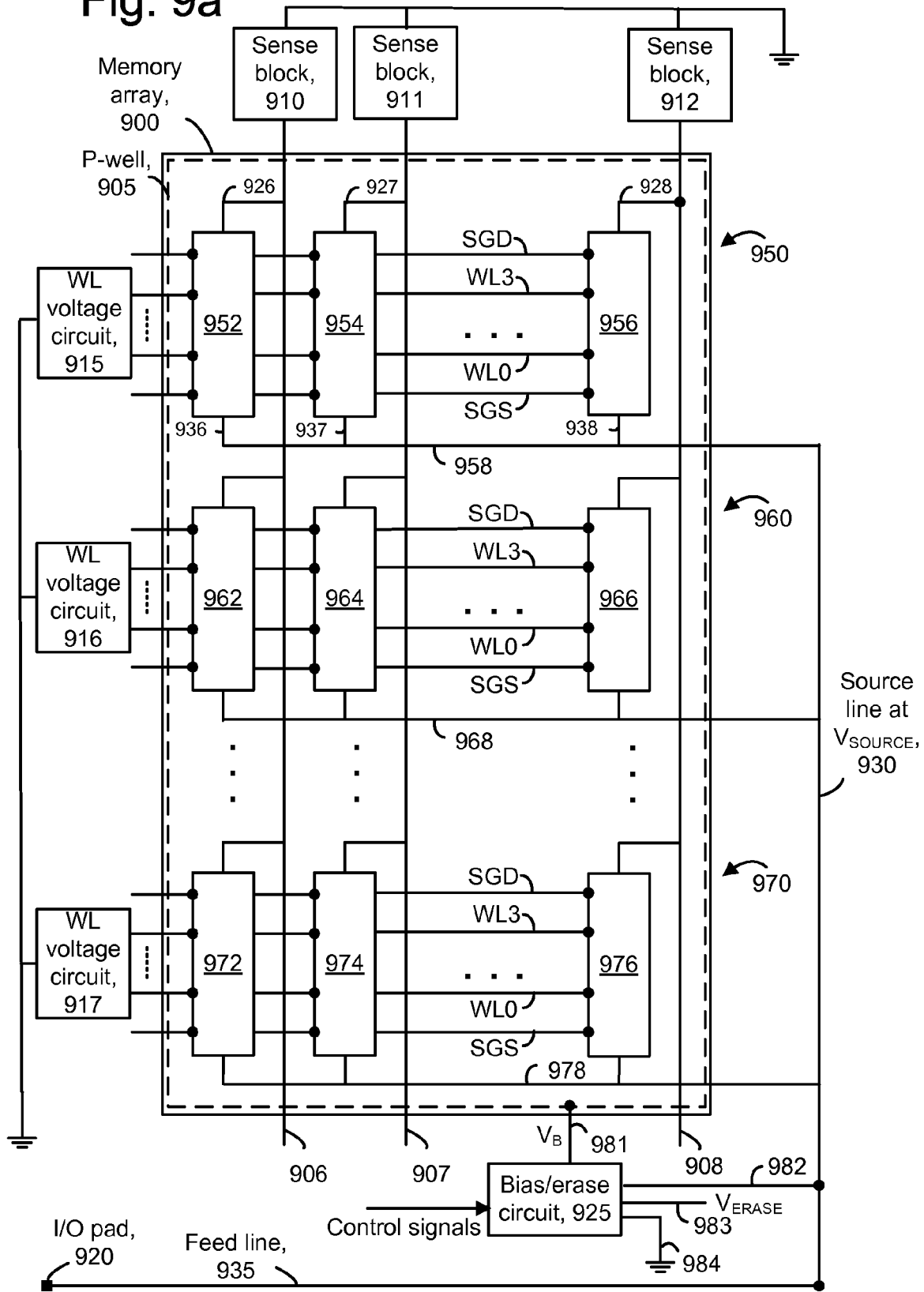

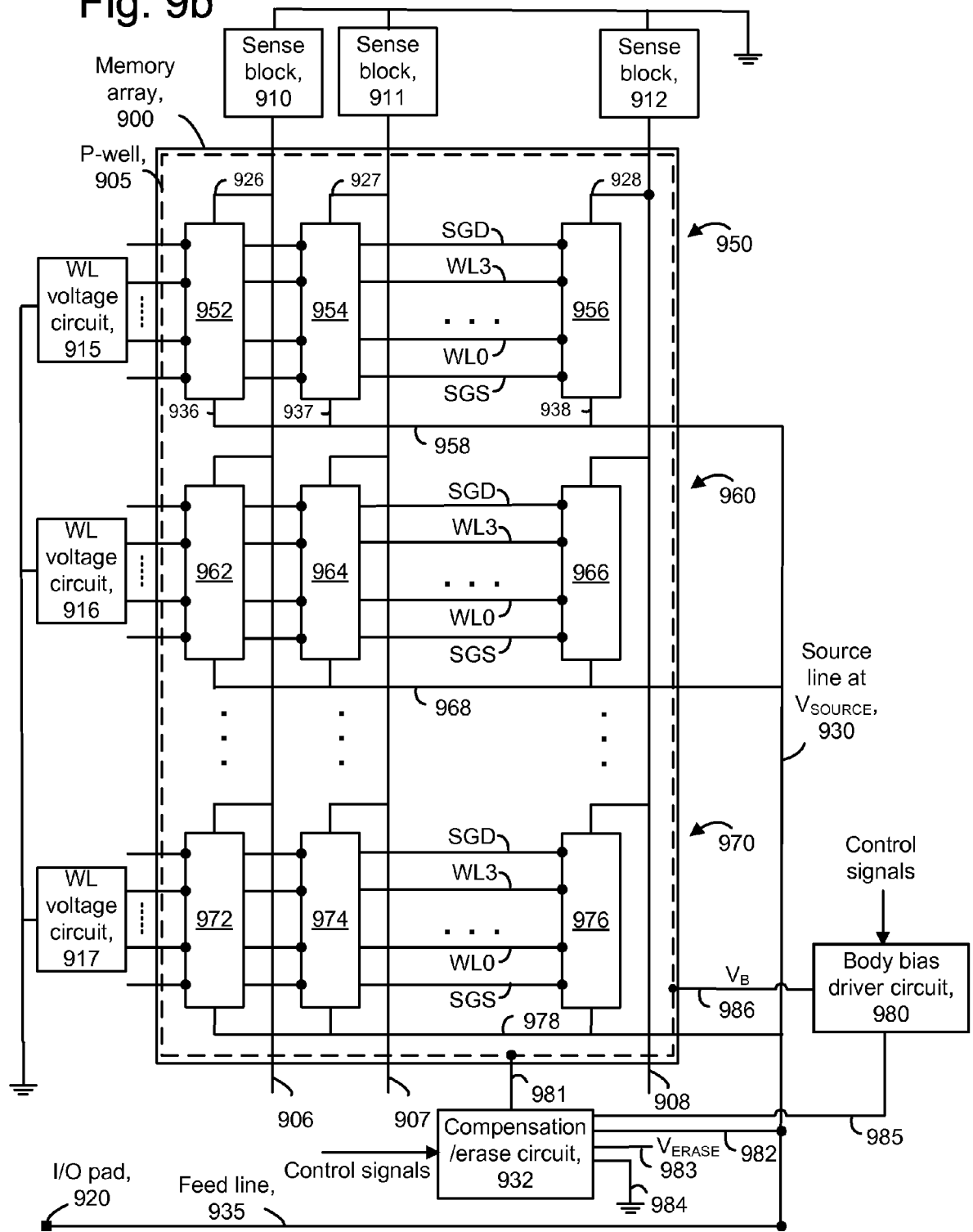

COMPENSATING SOURCE VOLTAGE DROP IN NON-VOLATILE STORAGE

CROSS-REFERENCE TO RELATED APPLICATIONS

This application is related to commonly assigned U.S. patent application Ser. No. 11/739,509, filed herewith on Apr. 24, 2007 and published as US 2008/0266964 on Oct. 30, 2008, titled "Non-Volatile Storage With Compensation for Source Voltage Drop", incorporated herein by reference.

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Patent App. Pub. 2005/0024939, titled "Detecting Over Programmed Memory," published Feb. 3, 2005; both of which are incorporated herein by reference in their entirety.

However, one issue with conventional memory devices is source line bias error, which is particularly acute for memory architectures where a large number memory cells have their sources tied together in a source line to ground. Parallel sensing of these memory cells can result in a substantial current through the source line. Due to a finite resistance of the source line, an appreciable voltage drop can occur which affects the accuracy of a sensing operation. Improved techniques are needed for compensating for such voltage drops.

SUMMARY OF THE INVENTION

The present invention addresses the above and other issues by providing a method for operating non-volatile storage in which a source voltage drop is compensated.

In one embodiment, a method for operating a non-volatile storage system includes performing a first operation, such as a read or verify operation, on at least one non-volatile storage element in a set of non-volatile storage elements, where the set of non-volatile storage elements is formed, at least in part, on a substrate, and during the first operation, biasing the substrate according to a first voltage which is based on a voltage of a source which is associated with the at least one non-volatile storage element. For example, the first voltage can be obtained by increasing the voltage of the source, or by reducing the voltage of the source. Or, the first voltage can be the same as the source voltage.

Further, the substrate is coupled to a ground during a second operation which can be a program operation, an erase-verify operation or sensing a negative threshold voltage of the at least one non-volatile storage element.

The set of non-volatile storage elements can be arranged in a number of NAND strings, in which case the source includes a common source line for the NAND strings, where the common source line is coupled to a feed line.

In another embodiment, a method for operating a non-volatile storage system includes performing at least first and second operations on at least one non-volatile storage element in a set of non-volatile storage elements, where the set of non-volatile storage elements is formed, at least in part, on a substrate, and coupling the substrate to a source which is associated with the at least one non-volatile storage element during the first operation, and to a ground during the second operation.

In another embodiment, a method for operating a non-volatile storage system includes performing a first operation on at least one non-volatile storage element in a set of non-volatile storage elements, and during the first operation, compensating a potential applied to a control gate of the at least one non-volatile storage element. The compensating is based on, and is different than, a potential of a source which is associated with the at least one non-volatile storage element.

The set of non-volatile storage elements can be associated with a number of word lines, in which case the potential applied to the control gate is applied via at least one of the word lines.

In another embodiment, a method for operating a non-volatile storage system includes performing a first operation on at least one non-volatile storage element in a set of non-volatile storage elements, and during the first operation, compensating a potential applied to a drain which is associated with the at least one non-volatile storage element, where the compensating is based on, and is different than, a potential of a source which is associated with the at least one non-volatile storage element.

The set of non-volatile storage elements can be arranged in a number of NAND strings associated with respective bit lines, in which case the potential applied to the drain is applied via at least one of the bit lines.

BRIEF DESCRIPTION OF THE DRAWINGS

FIG. 6 depicts a process for biasing a substrate with a voltage which is a function of a source voltage, or coupling the substrate to a ground, during first and second operations, respectively.

FIG. 7a depicts a process for compensating a control gate voltage according to a voltage which is a function of a source voltage, or referencing the control gate voltage to a ground, during first and second operations, respectively.

FIG. 9a depicts an example of an array of storage elements, including different sets of NAND strings, where a body bias is applied based on a source voltage.

FIG. 9b depicts an example of an array of storage elements, including different sets of NAND strings, where a forward body bias is compensated based on a source voltage.

DETAILED DESCRIPTION

The present invention provides a method for operating non-volatile storage in which a source voltage drop is compensated.

Figure 1:
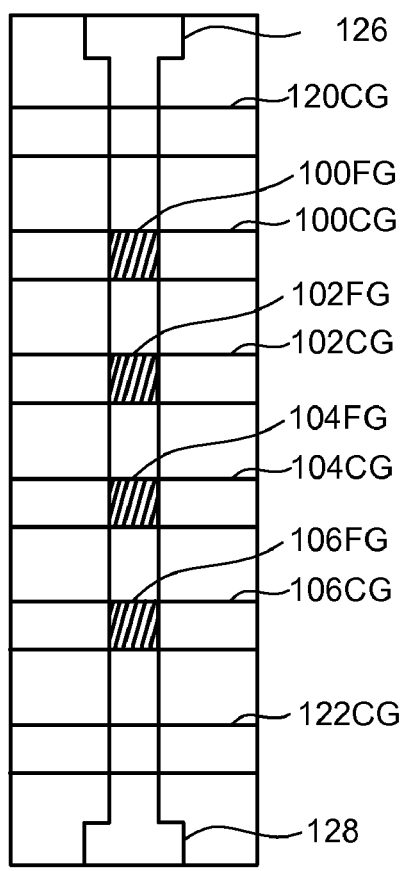
FIG. 1 is a top view of a NAND string.
Figure 2:
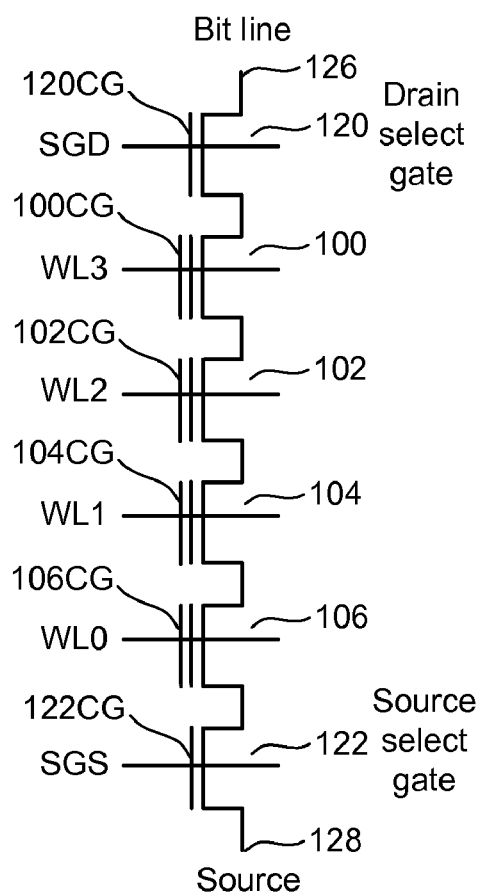
FIG. 2 is an equivalent circuit diagram of the NAND string of FIG. 1.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. The control gates can also be provided as portions of the word lines. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD (drain select gate). Select gate 122 is connected to select line SGS (source select gate).

Figure 3:
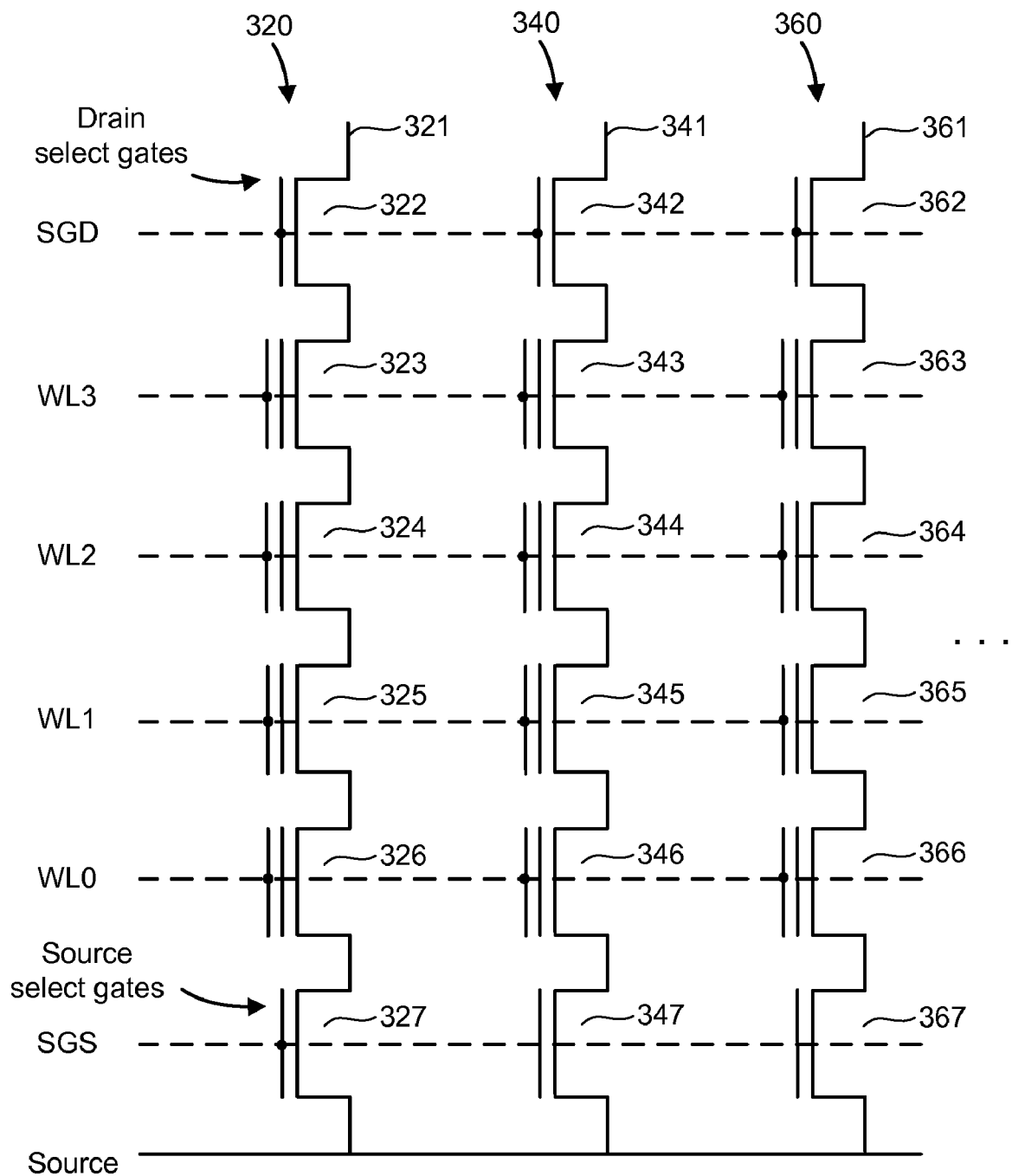
FIG. 3 is a block diagram of an array of NAND flash storage elements.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. No. 6,222,762 and U.S. Patent Application Pub. 2004/0255090, both of which are incorporated herein by reference in their entirety, describe various data encoding schemes for multi-state flash storage elements.

Relevant examples of NAND type flash memories and their operation are provided in U.S. Pat. Nos. 5,386,422, 5,522, 580, 5,570,315, 5,774,397, 6,046,935, 6,456,528 and 6,522, 580, each of which is incorporated herein by reference.

When programming a flash storage element, a program voltage is applied to the control gate of the storage element and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

Figure 4A:
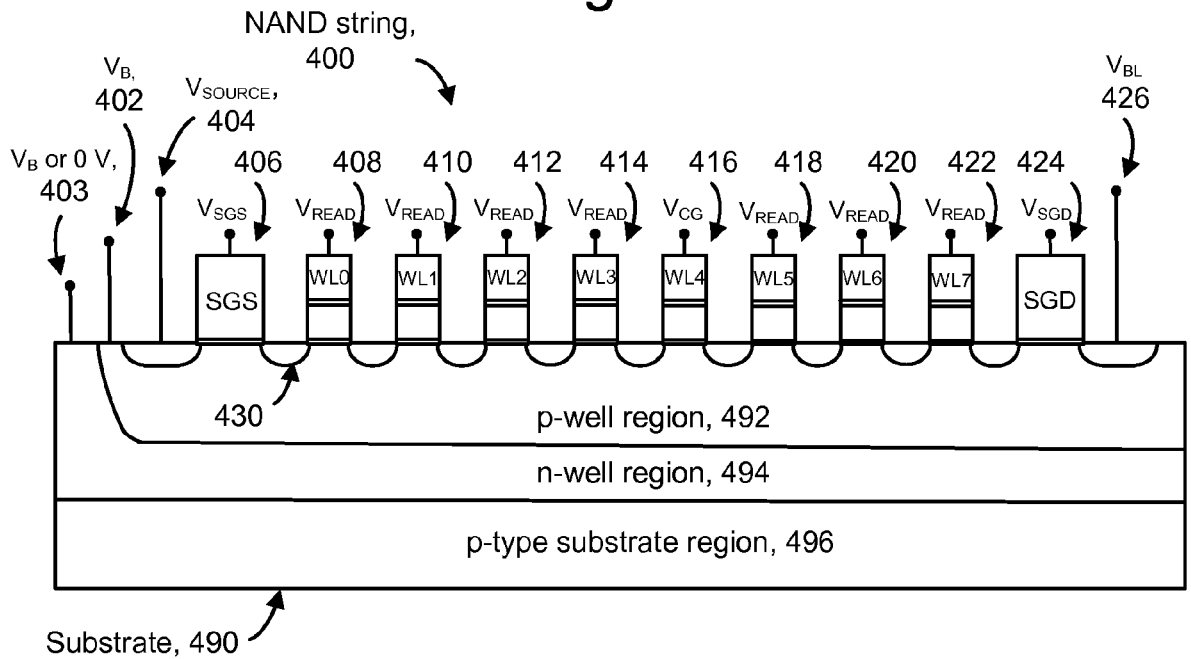
FIG. 4a depicts a cross-sectional view of a NAND string formed on a substrate.

FIG. 4a depicts a cross-sectional view of an NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 490. A number of source/drain regions, one example of which is source drain/region 430, are provided on either side of each storage element and the select gates 406 and 424. In one approach, the substrate 490 employs a triple-well technology which includes a p-well region 492 within an n-well region 494, which in turn is within a p-type substrate region 496. The NAND string and its non-volatile storage elements can be formed, at least in part, on the p-well region. A source supply line 404 with a potential of $V_{SOURCE}$ is provided in addition to a bit line 426 with a potential of $V_{BL}$. In one possible approach, a body bias voltage, $V_B$, is applied to the p-well region 492 via a terminal 402. A voltage can also be applied to the n-well region 494 via a terminal 403. In one approach, a bias is applied to the non-volatile storage elements by applying $V_B$ to the p-well region while grounding the n-well region (0V). In another approach, a bias is applied to the non-volatile storage elements by applying $V_B$ to both the p-well region and the n-well region.

During a read or verify operation, in which the condition of a storage element, such as its threshold voltage, is ascertained, $V_{CG}$ is provided on a selected word line, e.g., WL4, which is associated with a selected storage element, e.g., storage element 416. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A read pass voltage, $V_{READ}$, is applied to the remaining word lines associated with NAND string 400, in one possible boosting scheme. $V_{SGS}$ and $V_{SGD}$ are applied to the select gates 406 and 424, respectively.

Figure 4B:
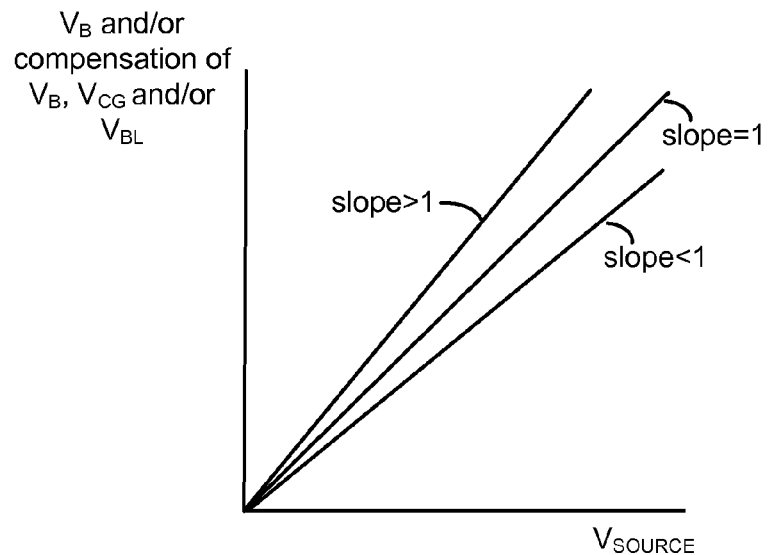
FIG. 4b depicts a relationship between a source voltage and a bias or compensation voltage.

FIG. 4b depicts a relationship between a source voltage, $V_{SOURCE}$, and a bias or compensation voltage. As mentioned at the outset, one issue with conventional memory devices is source line bias error, in which parallel sensing of memory cells can result in a substantial current through the source line. Due to a finite resistance of the source line, an appreciable voltage drop can occur which affects the accuracy of a sensing operation, e.g., a read or verify operation. For example, source voltage drop can be as high as 0.3 V in some NAND flash memory chips. Most of the source voltage drop problem arises from the resistance of the wires feeding the source M2 mesh.

One approach is to track the drain and gate voltages with respect to the source voltage, so that $V_{GS}$ (gate potential relative to source potential) and $V_{DS}$ (drain potential relative to source potential) stay constant even though the source voltage, $V_{SOURCE}$, may change. In one approach, the drain voltage is the bit line voltage, $V_{BL}$. The body voltage, however, is not compensated since it is generally thought that the impact of $V_{BS}$ (body potential relative to source potential) on $V_{TH}$ is much smaller than the impact of $V_{GS}$ and $V_{DS}$.

An experiment conducted on a 56 nm memory device revealed how the body effect due to source voltage drop impacts $V_{TH}$. In particular, a baseline condition was set in which $V_{SOURCE}$=0 V, $V_{BL}$=0.5 V and $V_B$=0 V, in which case $V_{TH}$=0.8 V. Next, $V_{SOURCE}$ is increased to 0.3 V, which results in $V_{TH}$ increasing to 1.6 V, indicating that the source voltage drop results in a substantial error in $V_{TH}$. Next, $V_{BL}$ is referenced to the source instead of to ground so that $V_{BL}$ is increased by 0.3 V, the amount of the source voltage drop, to 0.8 V. This results in $V_{TH}$ dropping to 1.35 V. Next, the control gate voltage, $V_{CG}$, is also referenced to the source instead of to ground, so that $V_{CG}$ is increased by 0.3 V, the amount of the source voltage drop. This results in $V_{TH}$ dropping further to 1.05 V. Next, $V_B$, which is equal to $V_{SOURCE}$, e.g., 0.3 V, is applied to the p-well, which results in $V_{TH}$ dropping further to 0.85 V, which is almost at the baseline condition of 0.8 V. Thus, it can be seen that compensating the body effect in addition to compensating the drain and gate voltages, when source potential rises, is effective in offsetting the source voltage drop.

In the above example, the body bias, $V_B$, control gate voltage, $V_{CG}$, and/or drain voltage, represented by bit line voltage, $V_{BL}$, are based on the source line voltage, $V_{SOURCE}$. To provide the body bias $V_B$ at the level of $V_{SOURCE}$, an output line which feeds the body can be connected to the source wiring mesh of a non-volatile memory device. For instance, a source wiring mesh may be associated with a plane which includes a number of blocks of non-volatile elements. In this case, $V_B$ is equivalent to $V_{SOURCE}$, as indicated by the line in FIG. 4b in which the slope=1. Thus, $V_B$ changes as $V_{SOURCE}$ changes. In another approach, $V_B$ is set as a function of $V_{SOURCE}$ and is different than $V_{SOURCE}$. For example, a voltage boosting circuit can be used which boosts $V_{SOURCE}$ according to a ratio which is greater than one, e.g., 1.1:1, as indicated by the line in FIG. 4b in which the slope>1. Or, a voltage reducing circuit can be used which reduces $V_{SOURCE}$ according to a ratio which is less than one, e.g., 0.9:1, as indicated by the line in FIG. 4b in which the slope<1. Providing $V_B$>$V_{SOURCE}$ or $V_B$<$V_{SOURCE}$ may prove useful in providing an optimal correction of $V_{TH}$ sensing errors for particular memory devices. Note that $V_B$>0 denotes a forward body bias and $V_B$<0 denotes a reverse body bias.

Further, $V_{CG}$ and/or $V_{BL}$ can be set based on $V_{SOURCE}$ such as by coupling ground paths of word line voltage circuits and/or sense blocks associated with bit lines to the source wiring mesh. In this case, $V_{CG}$ and/or $V_{BL}$ are compensated or offset by $V_{SOURCE}$, as indicated by the line in FIG. 4b in which the slope=1. It is also possible to compensate $V_{CG}$ and/or $V_{BL}$ by a value which is based on $V_{SOURCE}$ but is greater than $V_{SOURCE}$, as indicated by the line in FIG. 4b in which the slope>1, or less than $V_{SOURCE}$, as indicated by the line in FIG. 4b in which the slope<1. Compensating $V_{CG}$ and/or $V_{BL}$ in this manner may prove useful in providing an optimal correction of $V_{TH}$ sensing errors for particular memory devices. For example, providing extra compensation for $V_{CG}$ and/or $V_{BL}$ can make up for the body effect. That is, when $V_{SOURCE}$ goes up by 0.3 V, for instance, due to the source voltage drop, $V_{CG}$ and/or $V_{BL}$ could be raised by more than 0.3 V to compensate for the body effect. This implementation could be used, e.g., if the body RC delay is too high or the driver area for the p-well is much bigger than the extra circuit area needed for compensating $V_{CG}$ and/or $V_{BL}$ by an additional amount. Similarly, if it is difficult to compensate $V_{CG}$ based on $V_{SOURCE}$, e.g., due to floor planning issues, $V_{BL}$ and/or $V_B$ could be compensated by an additional amount instead. Thus, it is possible to compensate $V_{CG}$ and/or $V_{BL}$ with $V_B$=0, to apply a non-zero $V_B$ without compensating $V_{CG}$ and/or $V_{BL}$ and to compensate $V_{CG}$ and/or $V_{BL}$ while applying a non-zero $V_B$. One form of applying reverse body bias involves keeping the body voltage=0 V, but increasing the source, gate and drain voltages by a certain amount corresponding to the reverse body bias value. In this scenario, it might be useful to leave the body uncompensated with source potential changes and instead compensate control gate or bit line voltages. The degree of compensation, e.g., whether the slope in FIG. 4b=1, <1 or >1 is another variable which can be optimized.

In another example embodiment, which does not necessarily involve a source line bias, a forward body bias ($V_B$>0) can be used, e.g., in NAND flash memories where the body is charged to a small positive voltage such as 0.4 V. For example, such a forward body bias could be used to compensate for temperature effects. In one such approach, a higher $V_B$ is applied at lower temperatures. In chips where such forward body bias schemes are used, one could reference the well bias generators and drivers to the source, or to a voltage which is a function of the source, instead of to real ground. When a reverse body bias is used, e.g., $V_B$<$V_{SOURCE}$, the p-well is connected to 0 V.

Figure 5:
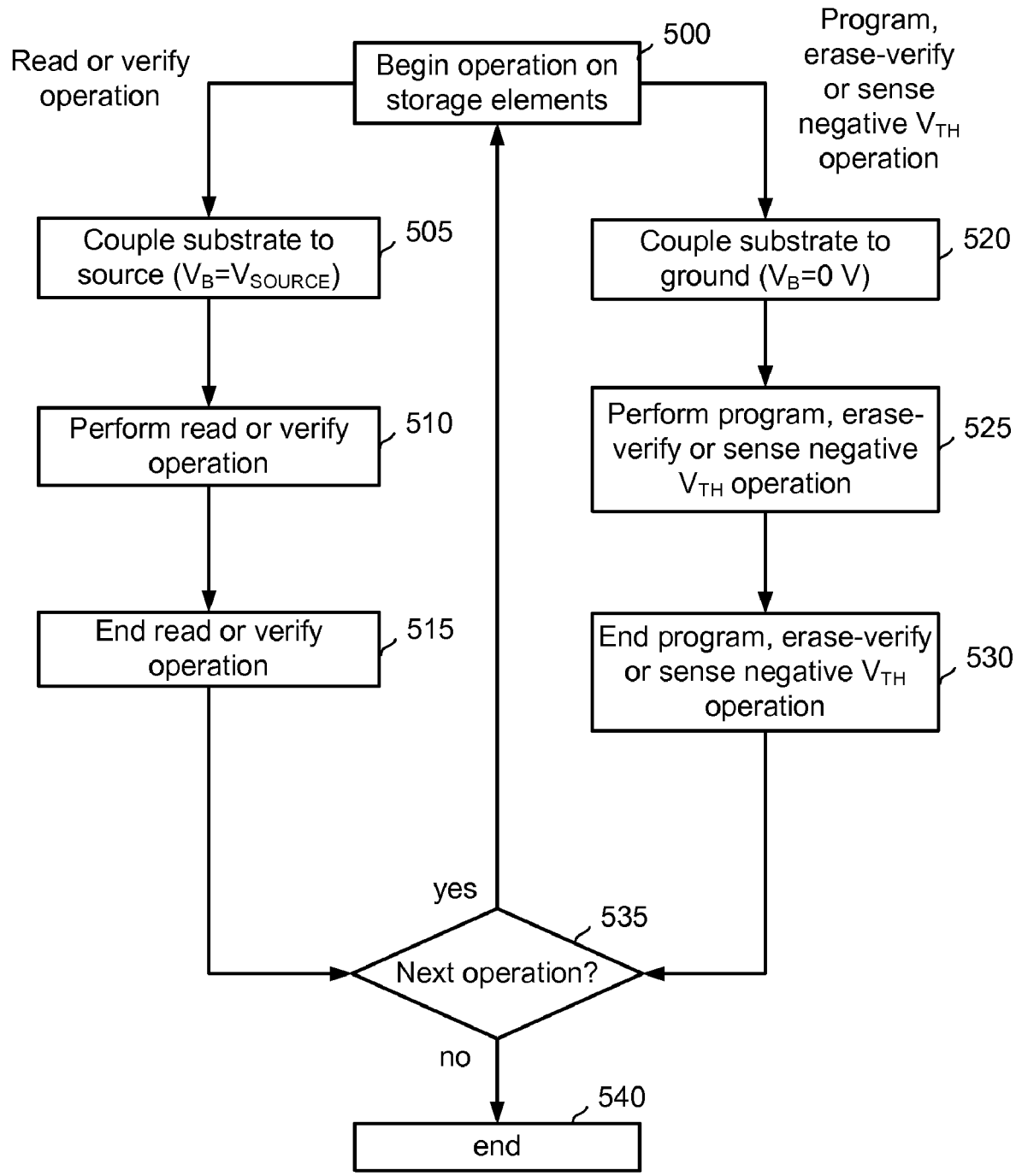
FIG. 5 depicts a process for coupling a substrate to a source or a ground during first and second operations, respectively.

FIG. 5 depicts a process for coupling a substrate to a source or a ground during first and second operations, respectively. Note that in this and other flowcharts provided herein, the steps indicated are not necessarily discrete steps which are performed separately and are not necessarily performed in the order shown. In this approach, a body bias of $V_B$=$V_{SOURCE}$ is applied to the substrate of a non-volatile storage device during first operations such as verify and read operations. These are sensing operations in which a current can flow in the source line and an associated feed line, resulting in a source voltage drop. During other, second operations, the substrate can be grounded. These other operations may include program operations, in which a program pulse is applied to the control gates of selected storage elements via a selected word line, erase-verify operations, in which a storage element is verified to be in an erased state, and/or operations which involve sensing a negative $V_{TH}$ of a storage element. These situations generally do not involve inaccuracies due to a source voltage drop. Thus, a switching back and forth between biasing the substrate and grounding the substrate can occur, in one possible approach. Other approaches are possible as well. For example, a non-zero body bias may be used during the second operations as well as during the first operations.

In particular, at step 500, an operation on one or more storage elements begins. If the operation is a read or verify operation, the substrate is coupled to the source at step 505, so that $V_B$=$V_{SOURCE}$, the read or verify operation is performed at step 510, and the read or verify operation ends at step 515. If there is another operation to perform, at decision step 535, the control flow proceeds again to step 500. If there is no next operation, the control flow ends at step 540. On the other hand, if the operation is a program, erase-verify and/or sensing a negative $V_{TH}$ operation, the substrate is coupled to a ground at step 520 so that $V_B$=0 V, the program, erase-verify and/or sensing a negative $V_{TH}$ operation is performed at step 525, and the program, erase-verify and/or sensing a negative $V_{TH}$ operation ends at step 530. If there is another operation to perform, at decision step 535, the control flow proceeds again to step 500. If there is no next operation, the control flow ends at step 540.

See also FIG. 9a and FIG. 12, discussed further below.

FIG. 6 depicts a process for biasing a substrate with a voltage which is a function of a source voltage, or coupling the substrate to a ground, during first and second operations, respectively. As mentioned, the biasing of the substrate can be at the same level as $V_{SOURCE}$ or at a different level that is a function of $V_{SOURCE}$. For example, a voltage boosting circuit can be used which boosts $V_{SOURCE}$ or a voltage reducing circuit can be used which reduces $V_{SOURCE}$. Such circuits can use hardware and/or software. Various implementations will be apparent to those skilled in the art.

In particular, at step 600, an operation on one or more storage elements begins. If the operation is a read or verify operation, a voltage $V_1$ is obtained as a function of $V_{SOURCE}$. The function can be linear or non-linear. An example of a linear function is one in which $V_1$ is a fixed percentage of $V_{SOURCE}$, e.g., 110% or 90%. An example of a non-linear function is one in which $V_1$ varies according to an exponential function, square function, step function and so forth. The substrate is biased with $V_1$ at step 610 so that $V_B = V_1$, the read or verify operation is performed at step 615, and the read or verify operation ends at step 620. If there is another operation to perform at decision step 640, the control flow proceeds again to step 600. If there is no next operation, the control flow ends at step 645. On the other hand, if the operation is a program, erase-verify and/or sensing a negative $V_{TH}$ operation, the substrate is coupled to a ground at step 625, so that $V_B = 0$ V, the program, erase-verify and/or sensing a negative $V_{TH}$ operation is performed, at step 630, and the program, erase-verify and/or sensing a negative $V_{TH}$ operation ends at step 635. If there is another operation to perform, at decision step 640, the control flow proceeds again to step 600. If there is no next operation, the control flow ends at step 645.

See also FIG. 9a and FIG. 13, discussed further below.

FIG. 7a depicts a process for compensating a control gate voltage according to a voltage which is a function of a source voltage, or referencing the control gate voltage to a ground, during first and second operations, respectively. As mentioned, the compensation of $V_{CG}$ can be based on the level of $V_{SOURCE}$ or a different level that is a function of $V_{SOURCE}$. For example, a voltage boosting/reducing circuit can be used, as discussed.

In particular, at step 700, an operation on one or more storage elements begins. If the operation is a read or verify operation, a voltage $V_2$ is obtained as a function of $V_{SOURCE}$ at step 705. The function can be linear or non-linear, as discussed. $V_{CG}$ is compensated by $V_2$, at step 710, so that $V_{CG}$ is referenced to $V_2$. For instance, if $V_{CG}$ without compensation, e.g., referenced to ground, is 5 V, $V_{CG}$ with compensation, e.g., referenced to $V_2$, is 5 V+$V_2$. Thus, the compensation changes $V_{CG}$ by $V_2$. The read or verify operation is performed at step 715, and the read or verify operation ends at step 720. If there is another operation to perform, at decision step 740, the control flow proceeds again to step 700. If there is no next operation, the control flow ends at step 745. On the other hand, if the operation is a program, erase-verify and/or sensing a negative $V_{TH}$ operation, $V_{CG}$ is referenced to a ground at step 725, in one possible approach, the program, erase-verify and/or sensing a negative $V_{TH}$ operation is performed at step 730, and the program, erase-verify and/or sensing a negative $V_{TH}$ operation ends at step 735. If there is another operation to perform, at decision step 740, the control flow proceeds again to step 700. If there is no next operation, the control flow ends at step 745.

See also FIG. 10 and FIG. 14, discussed further below.

Figure 7B:
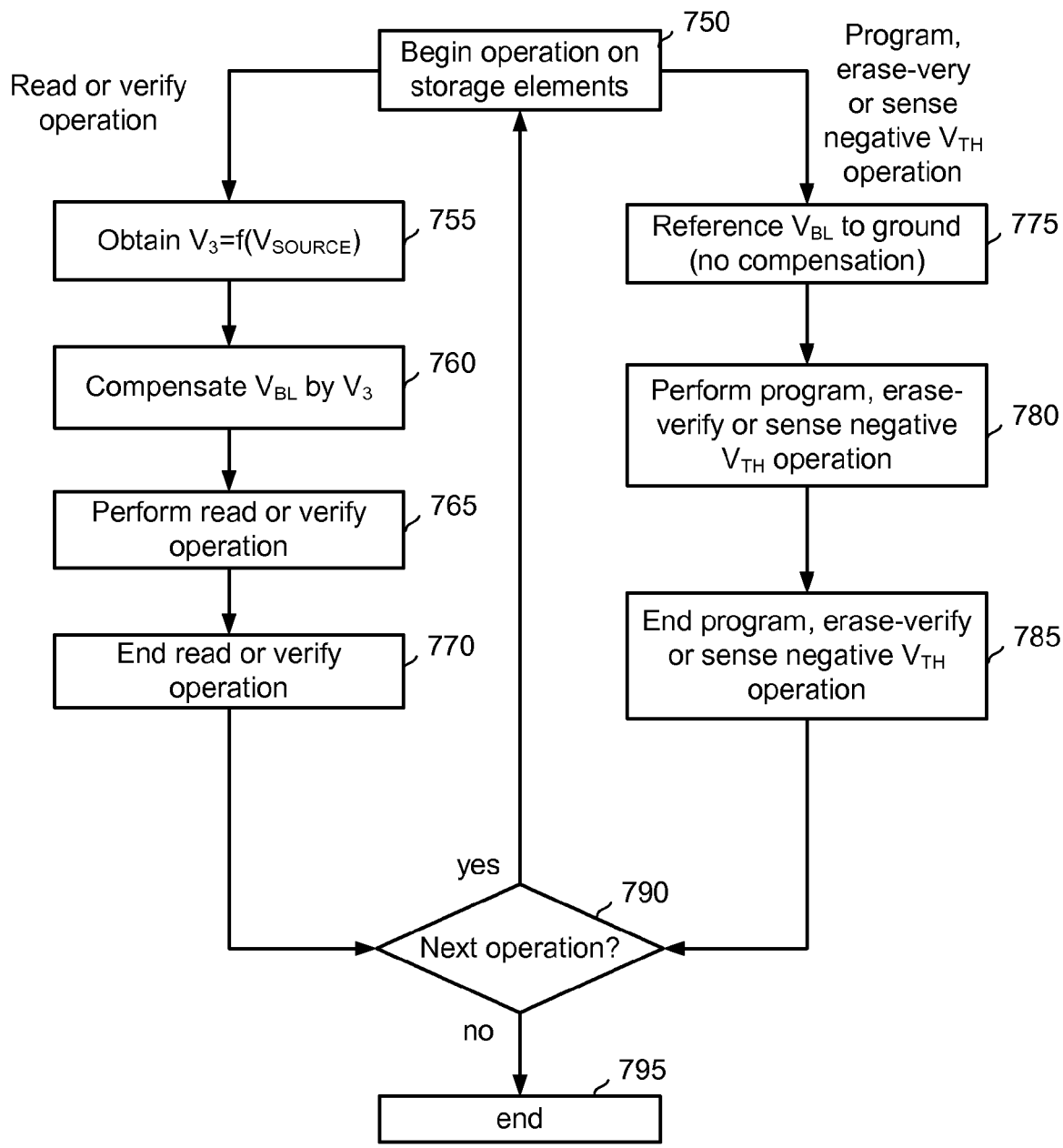
FIG. 7b depicts a process for compensating a bit line voltage according to a voltage which is a function of a source voltage, or referencing the bit line voltage to a ground, during first and second operations, respectively.

FIG. 7b depicts a process for compensating a bit line voltage according to a voltage which is a function of a source voltage, or referencing the bit line voltage to a ground, during first and second operations, respectively. FIG. 7b is analogous to FIG. 7a but refers to compensating a drain voltage which is represented by the bit line voltage $V_{BL}$ in one possible approach. As mentioned, the compensation of $V_{BL}$ can be based on the level of $V_{SOURCE}$ or a different level that is a function of $V_{SOURCE}$. For example, a voltage boosting/reducing circuit can be used, as discussed.

In particular, at step 750, an operation on one or more storage elements begins. If the operation is a read or verify operation, a voltage $V_3$ is obtained as a function of $V_{SOURCE}$ at step 755. The function can be linear or non-linear, as discussed. $V_{BL}$ is compensated by $V_3$, at step 760, so that $V_{BL}$ is referenced to $V_3$. For instance, if $V_{BL}$ without compensation, e.g., referenced to ground, is 3 V, $V_{BL}$ with compensation, e.g., referenced to $V_3$, is 3 V+$V_3$. Thus, the compensation changes $V_{BL}$ by $V_3$. The read or verify operation is performed at step 765, and the read or verify operation ends at step 770. If there is another operation to perform, at decision step 790, the control flow proceeds again to step 750. If there is no next operation, the control flow ends at step 795. On the other hand, if the operation is a program, erase-verify and/or sensing a negative $V_{TH}$ operation, $V_{BL}$ is referenced to a ground at step 775, in one possible approach, the program, erase-verify and/or sensing a negative $V_{TH}$ operation is performed, at step 780, and the program, erase-verify and/or sensing a negative $V_{TH}$ operation ends at step 785. If there is another operation to perform, at decision step 790, the control flow proceeds again to step 750. If there is no next operation, the control flow ends at step 795.

See also FIG. 11 and FIG. 14, discussed further below.

As mentioned, various combinations of body biasing, control gate compensation and bit line compensation can be used by performing the processes of FIG. 5 or FIG. 6, FIG. 7a and/or FIG. 7b in combination.

Figure 8:
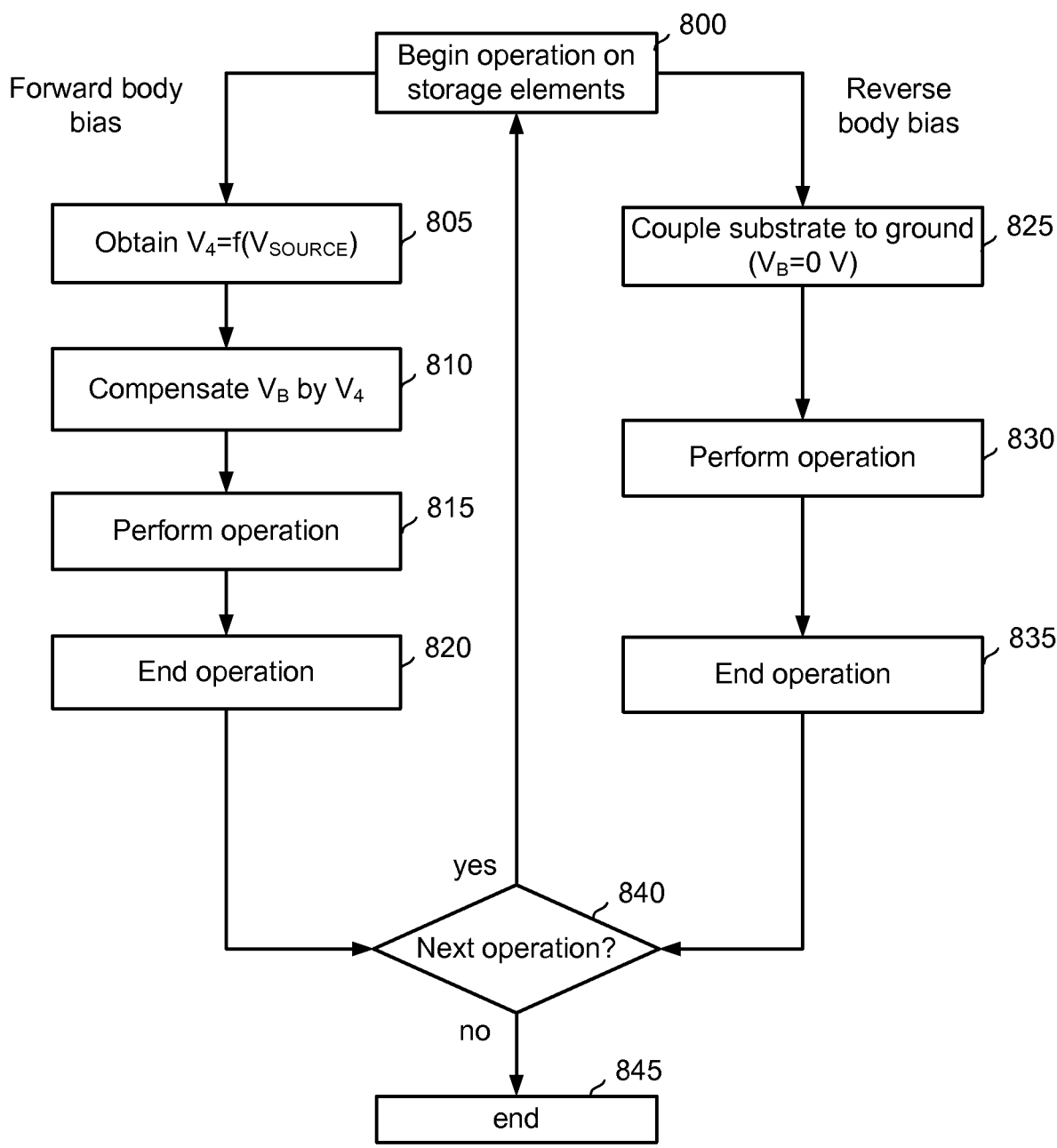
FIG. 8 depicts a process for compensating a forward body bias according to a voltage which is a function of a source voltage, or coupling a substrate to a ground when applying a reverse body bias.

FIG. 8 depicts a process for compensating a forward body bias according to a voltage which is a function of a source voltage, or coupling a substrate to a ground when applying a reverse body bias. As mentioned previously, in another example embodiment, which does not necessarily involve a source line bias, a forward body bias ($V_B$>0) can be used, e.g., in NAND flash memories where the body is charged to a small positive voltage such as 0.4 V. For example, such a forward body bias could be used to compensate for temperature effects. In one such approach, a higher $V_B$ is applied at lower temperatures. In chips where such forward body bias schemes are used, one could reference the well bias generators and drivers to the source, or to a voltage which is a function of the source, instead of to real ground. When a reverse body bias is used, e.g., $V_B$<$V_{SOURCE}$, the p-well is connected to 0 V. See also FIG. 9b.

In particular, at step 800, an operation on one or more storage elements begins. If a forward body bias ($V_B$) is applied, a voltage $V_4$ is obtained as a function of $V_{SOURCE}$ at step 805. In one approach, this decision path is taken when a control of the non-volatile storage system instructs a body bias driver circuit (FIG. 9b) to provide a forward body bias. Otherwise, the other decision path is taken. The function can be linear or non-linear, as discussed. $V_B$ is compensated by $V_4$, at step 810, so that $V_B$ is referenced to $V_4$. For instance, if $V_B$ without compensation, e.g., referenced to ground, is 0.4 V, $V_B$ with compensation, e.g., referenced to $V_4$, is 0.4 V+$V_4$.

Thus, the compensation changes $V_B$ by $V_4$. An operation, e.g., program, read or verify, is performed at step 815, and the operation ends at step 820. If there is another operation to perform, at decision step 840, the control flow proceeds again to step 800. If there is no next operation, the control flow ends at step 845. On the other hand, if a reverse body bias is applied, $V_B$ is coupled to ground at step 825, so that $V_B$=0 V. The operation is performed at step 830 and the operation ends at step 835. If there is another operation to perform, at decision step 840, the control flow proceeds again to step 800. If there is no next operation, the control flow ends at step 845.

See also FIG. 9b and FIGS. 12-14, discussed further below.

FIG. 9a depicts an example of an array or plane of storage elements, including different sets of NAND strings, where a body bias is applied based on a source voltage. The memory array 900 includes NAND string set 950 having NAND strings 952, 954, ..., 956, NAND string set 960 having NAND strings 962, 964, ..., 966, and NAND string set 970 having NAND strings 972, 974, ..., 976, all formed in p-well 905. Along each column, bit lines are coupled to the drain terminals respectively, of the drain select gates for the NAND strings. For example, for the NAND strings 952, 954, ..., 956, bit lines 906, 907, ..., 908 are coupled to the drain terminals 926, 927, ..., 928, respectively. Further, along each row of NAND strings, a common source voltage supply line may connect all the source terminals of the source select gates of the NAND strings. For example, supply line 958 connects the source terminals 936, 937, ..., 938 of the source select gates of the NAND strings 952, 954, ..., 956. Similarly, supply line 968 connects the source terminals of the source select gates of the NAND strings 962, 964, ..., 966, and supply line 978 connects the source terminals of the source select gates of the NAND strings 972, 974, ..., 976. Further details regarding an example of a NAND architecture array and its operation as part of a memory system is found in U.S. Pat. Nos. 5,570,315; 5,774,397; and 6,046,935.

A source supply line 930 is coupled to the supply lines 958, 968 and 978. The source lines 958, 968, 978 and 930 can be considered to part of a source or source mesh for the array 900. A feed line 935 couples the source line 930 to an input/output (I/O) pad 920. Generally, the source voltage drop occurs along the feed line 935, so that the supply lines 930, 958, 968 and 978 will have a potential of $V_{SOURCE}$, while the potential at the I/O pad 920 can be slightly less than $V_{SOURCE}$ due to the voltage drop.

Figure 15:
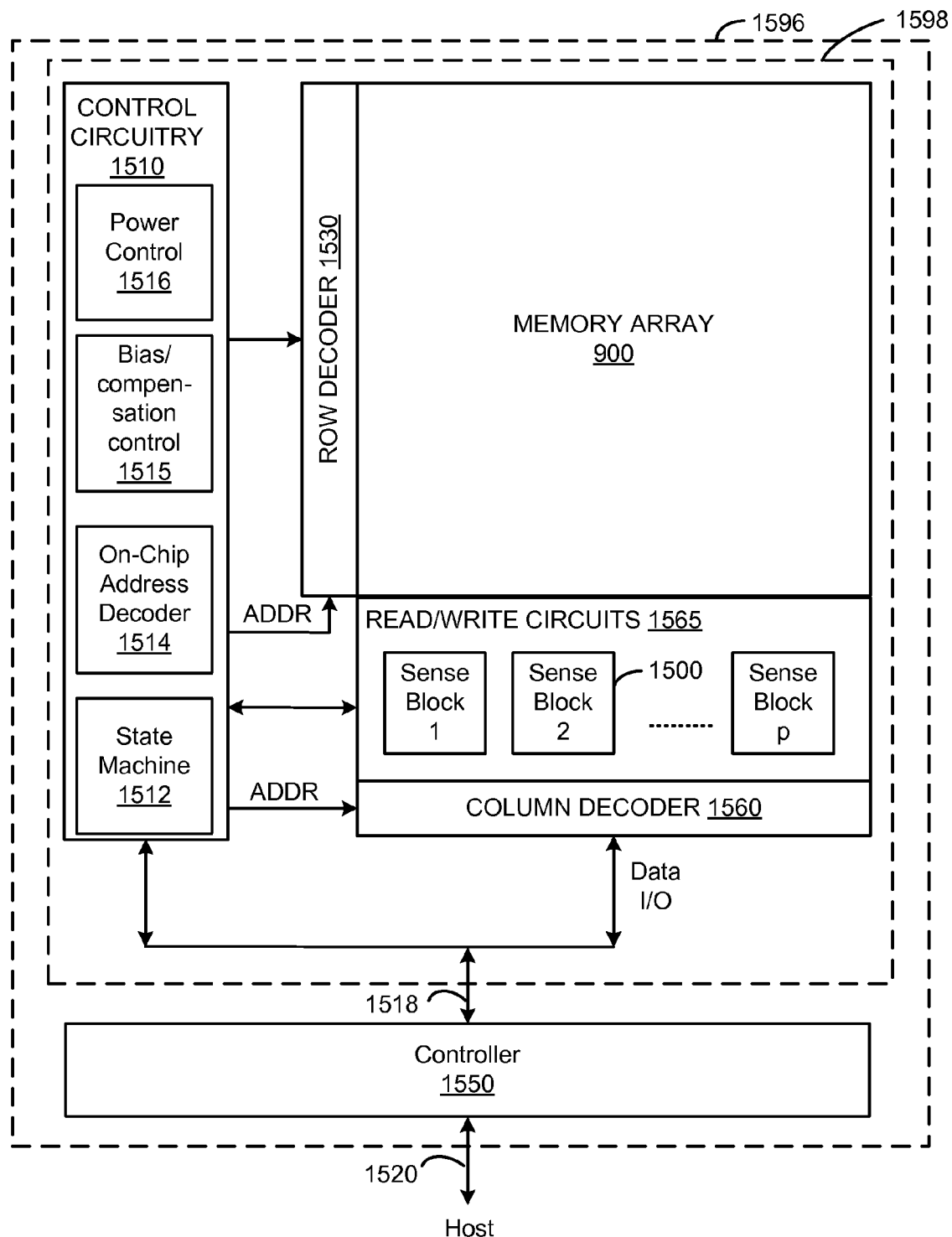
FIG. 15 is a block diagram of a non-volatile memory system using single row/column decoders and read/write circuits.

A bias/erase circuit 925 can provide a bias voltage $V_B$ to the substrate via a path 981 by selectively coupling the p-well 905 of the substrate to $V_{SOURCE}$, a voltage which is a function of $V_{SOURCE}$, an erase voltage, $V_{ERASE}$, or a ground voltage based on control signals received, e.g., from a bias/compensation control (see, e.g., FIG. 15). To this end, an input of the bias/erase circuit 925 can be coupled to the source line 930 via a path 982, for instance, or other location of the source mesh. $V_{ERASE}$, which is a relatively high voltage, is provided via a path 983 and the ground is coupled via a path 984. Further details regarding example implementations of the bias/erase circuit 925 are provided in FIGS. 12 and 13. Word line (WL) voltage circuits 915, 916 and 917 which are associated with the NAND string sets 950, 960 and 970, respectively, are referenced to ground in this example. The WL voltage circuits 915, 916 and 917 provide voltages to the associated word lines as required for read, verify, programming, and other operations. Control gates of the storage elements communicate with the word lines, or are provided by portions of the word lines. Similarly, sense blocks 910, 911 and 912 which are associated with the bit lines 906, 907 and 908, respectively, are referenced to ground in this example. Sense blocks are discussed further below in connection with FIG. 15. The sense blocks 906, 907 and 908 provide voltages to the associated bit lines as required for various operations including reading and verifying.

FIG. 9b depicts an example of an array of storage elements, including different sets of NAND strings, where a forward body bias is compensated based on a source voltage. Like-numbered components are the same as in FIG. 9a. In this example, a body bias driver circuit 980 is used to provide a forward body bias to the p-well 905 via a path 986. Additionally, the WL voltage circuits 915, 916 and 917, and the sense blocks 910, 911 and 912 are referenced to ground. This example is distinguished by the fact that the body bias driver circuit 980 is referenced to a voltage at the output of a compensation/erase circuit 932 rather than to ground, based on control signals received, e.g., from a bias/compensation control (see, e.g., FIG. 15). Further details regarding an example implementation of the compensation/erase circuit 932 are provided in FIGS. 12-14. In particular, the compensation circuit 932 can provide a compensation or reference voltage $V_4$ by boosting or reducing $V_{SOURCE}$ when the forward body bias is applied. To this end, an input of the compensation/erase circuit 932 can be coupled to the source line 930 via the path 982, for instance, or other location of the source mesh. The compensation/erase circuit 932 can communicate with the body bias driver circuit via a path 985.

Figure 10:
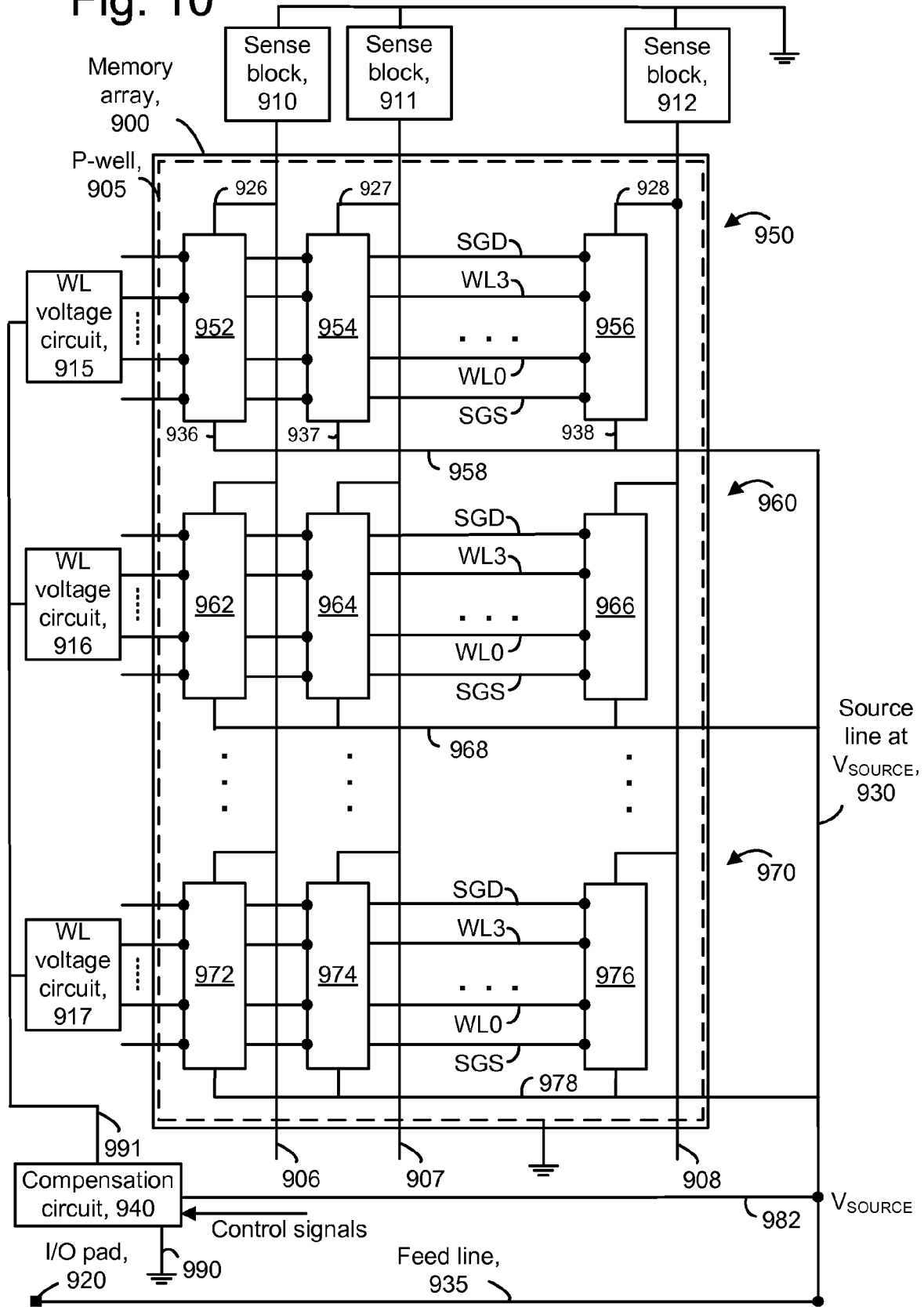
FIG. 10 depicts an example of an array of storage elements, including different sets of NAND strings, where a control gate voltage is compensated based on a source voltage.

FIG. 10 depicts an example of an array of storage elements, including different sets of NAND strings, where a control gate voltage is compensated based on a source voltage. Like-numbered components are the same as in FIG. 9a. In this example, no body bias is provided. Additionally, the sense blocks 910, 911 and 912 are referenced to ground. This example is distinguished by the fact that the WL voltage circuits 915, 916 and 917 are referenced to a voltage at the output of a compensation circuit 940 rather than to ground, based on control signals received, e.g., from a bias/compensation control (see, e.g., FIG. 15). Further details regarding an example implementation of the compensation circuit 940 are provided in FIG. 14. In particular, the compensation circuit 940 can provide a compensation or reference voltage $V_2$ by boosting or reducing $V_{SOURCE}$ when read and verify operations, for instance, are performed. To this end, an input of the compensation circuit 940 can be coupled to the source line 930 via the path 982, for instance, or other location of the source mesh. The compensation circuit 940 can also reference the WL voltage circuits 915, 916 and 917 to ground when other operations are performed. The compensation circuit 940 communicates with the WL voltage circuits 915, 916 and 917 via a path 991 and with a ground via a path 990. The output of the WL voltage circuits 915, 916 and 917, $V_{CG}$, is provided to the control gates of the storage elements on the word line.

Figure 11:
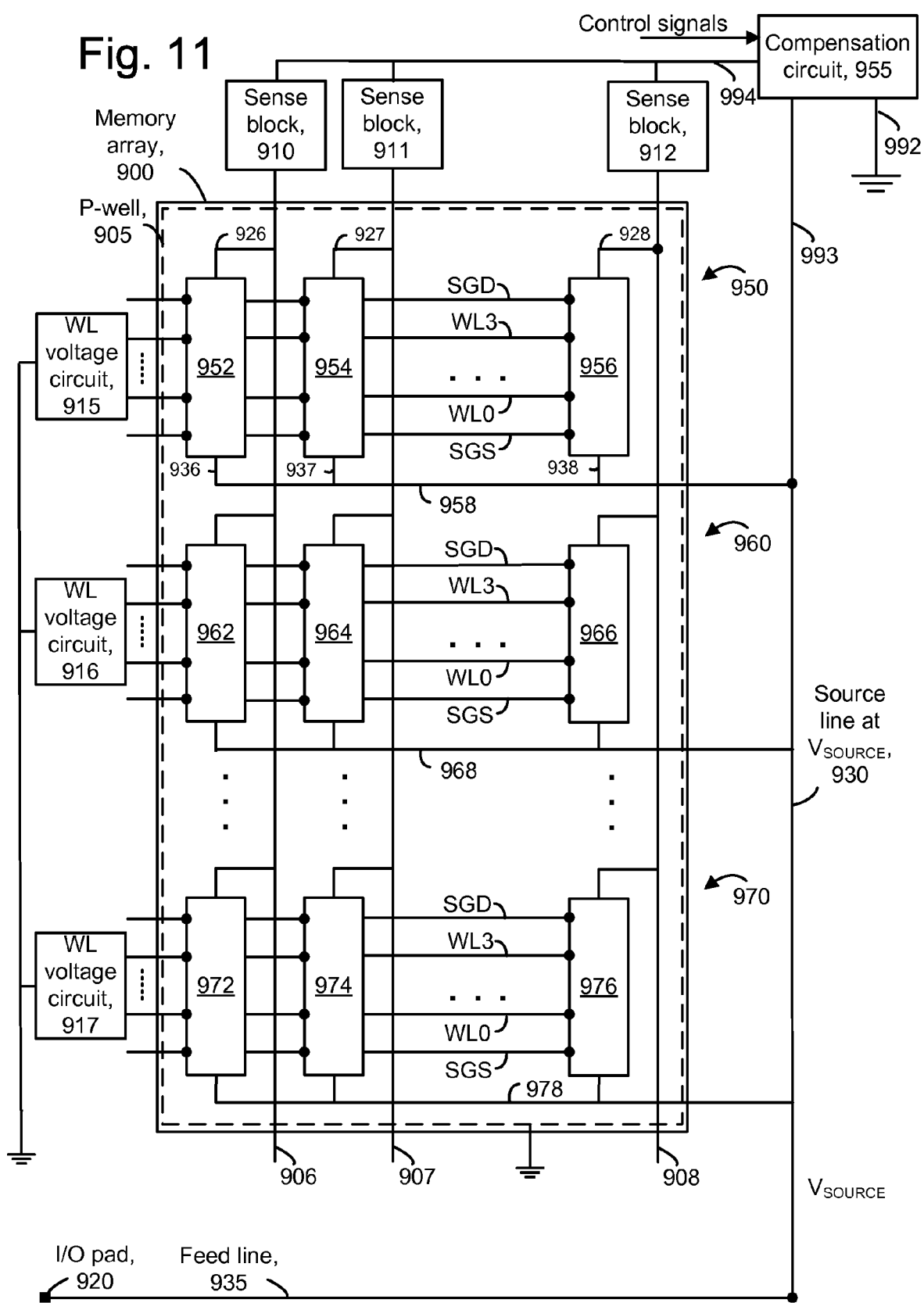
FIG. 11 depicts an example of an array of storage elements, including different sets of NAND strings, where a bit line voltage is compensated based on a source voltage.

FIG. 11 depicts an example of an array of storage elements, including different sets of NAND strings, where a bit line voltage is compensated based on a source voltage. Like-numbered components are the same as in FIG. 9a. In this example, no body bias is provided. Additionally, the WL voltage circuits 915, 916 and 917 are referenced to ground. This example is distinguished by the fact that the sense blocks 910, 911 and 912 are referenced to a voltage at the output of a compensation circuit 955 rather than to ground, based on control signals received, e.g., from a bias/compensation control (see, e.g., FIG. 15). Further details regarding an example implementation of the compensation circuit 955 are provided in FIG. 14. In particular, the compensation circuit 955 can provide a compensation or reference voltage $V_3$ by boosting or reducing $V_{SOURCE}$ when read and verify operations, for instance, are performed. To this end, an input of the compensation circuit 955 can be coupled to the source line 930 via a path 993, for instance, or other location of the source mesh. The compensation circuit 955 can also reference the sense blocks 910, 911 and 912 to ground when other operations are performed. The compensation circuit 955 communicates with the sense blocks 910, 911 and 912 via a path 994 and with a ground via a path 992.

As mentioned, various combinations of body biasing, control gate compensation and bit line compensation can be used by combining components of the circuits of FIGS. 9a, 10 and/or 11. The functionality of the circuit of FIG. 9b can also be combined with the functionality of one or more of the other circuits.

Figure 12:
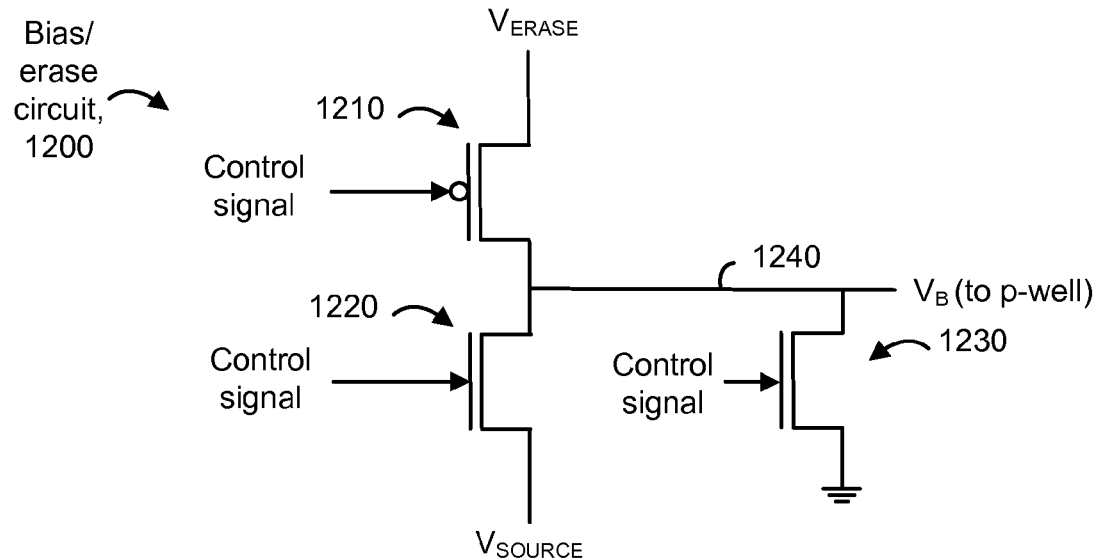
FIG. 12 depicts a bias/erase circuit which couples an output line to a source voltage, an erase voltage or to ground.

FIG. 12 depicts a bias/erase circuit which couples an output line to a source voltage, an erase voltage or to ground. The bias/erase circuit 1200 includes switches such as a p-MOS transistor 1210 and n-MOS transistors 1220 and 1230. In a first mode, when it is desired to erase an array of storage elements, the transistor 1210 is turned on and the transistors 1220 and 1230 are turned off to pass an erase voltage $V_{ERASE}$ to an output line 1240 which, in turn, is coupled to the substrate of the array as the bias voltage $V_B$. In a second mode, such as during a read or verify operation, the transistors 1210 and 1230 are turned off, and the transistor 1220 is turned on, to pass the source voltage $V_{SOURCE}$ to the output line 1240. In a third mode, such as during a program, erase-verify or sensing negative $V_{TH}$, the transistors 1210 and 1220 are turned off, and the transistor 1230 is turned on, to couple the output line 1240 and the substrate of the array to ground. Appropriate control signals can be provided to control the transistors, e.g., by the bias/compensation control of FIG. 15.

Generally, coupling the p-well to the source during verify and read operations reduces the total capacitance that needs to be switched. Further, the extra n-MOS transistor 1230 referenced to ground can help maintain backwards compatibility to previous designs. The transistor 1220 should be large.

The compensation/erase circuit 932 of FIG. 9b can also be provided using the bias/erase circuit 1200, in which case the output line 1240 is coupled to the body bias driver circuit 980 to compensate the forward body bias $V_B$.

Figure 13:
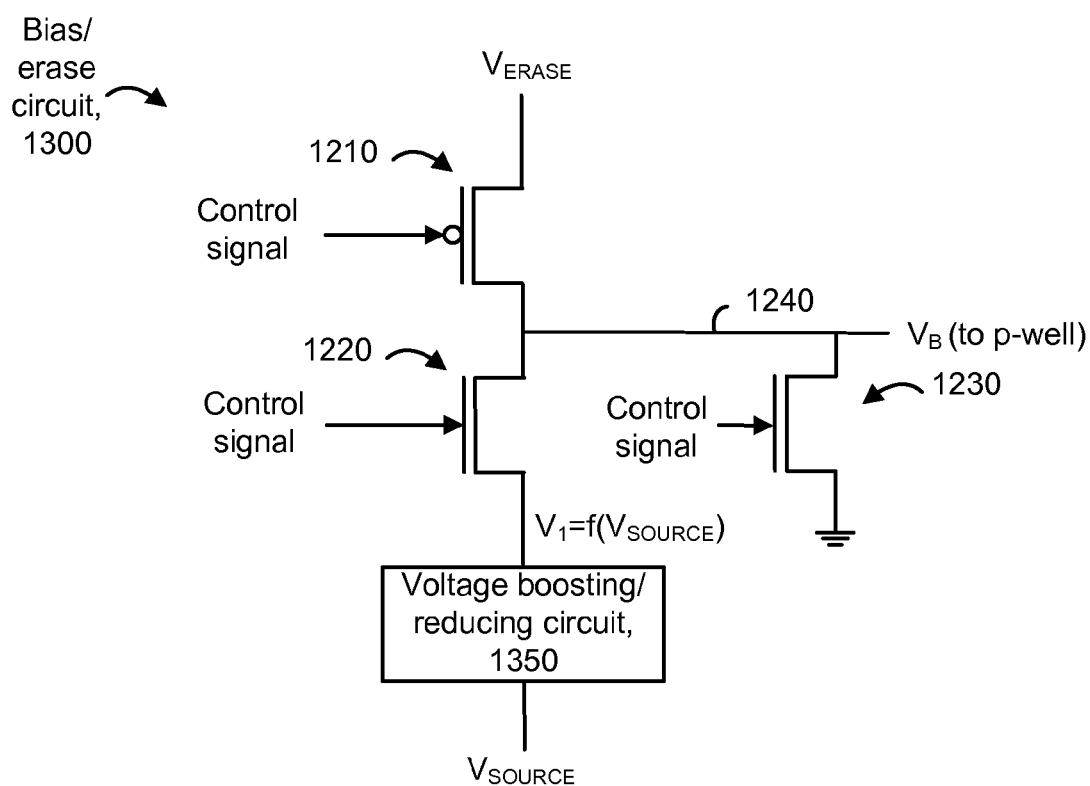
FIG. 13 depicts a bias/erase circuit which couples an output line to an output of a voltage boosting/reducing circuit, an erase voltage or to ground.

FIG. 13 depicts a bias/erase circuit which couples an output line to an output of a voltage boosting/reducing circuit, an erase voltage or to ground. Like-numbered elements correspond to those in FIG. 12. Here, a voltage boosting/reducing circuit 1350 is provided which can boost or reduce $V_{SOURCE}$, the voltage level of an input, thereby providing an output at a level of $V_1$. The voltage boosting/reducing circuit 1350 receives the potential of the source as an input and provides an output whose potential is higher or lower than the potential of the source. In a first mode, when it is desired to erase an array of storage elements, the transistor 1210 is turned on and the transistors 1220 and 1230 are turned off to pass an erase voltage $V_{ERASE}$ to the output line 1240. In a second mode, such as during a read or verify operation, the transistors 1210 and 1230 are turned off, and the transistor 1220 is turned on, to pass $V_1$ to the output line 1240. In a third mode, such as during a program, erase-verify or sensing negative $V_{TH}$, the transistors 1210 and 1220 are turned off, and the transistor 1230 is turned on, to couple the output line 1240 and the substrate of the array to ground. Appropriate control signals can be provided to control the transistors, e.g., by the bias/compensation control of FIG. 15.

The compensation/erase circuit 932 of FIG. 9b can also be provided using the bias/erase circuit 1300, in which case the output line 1240 is coupled to the body bias driver circuit 980 to compensate the forward body bias $V_B$.

Figure 14:
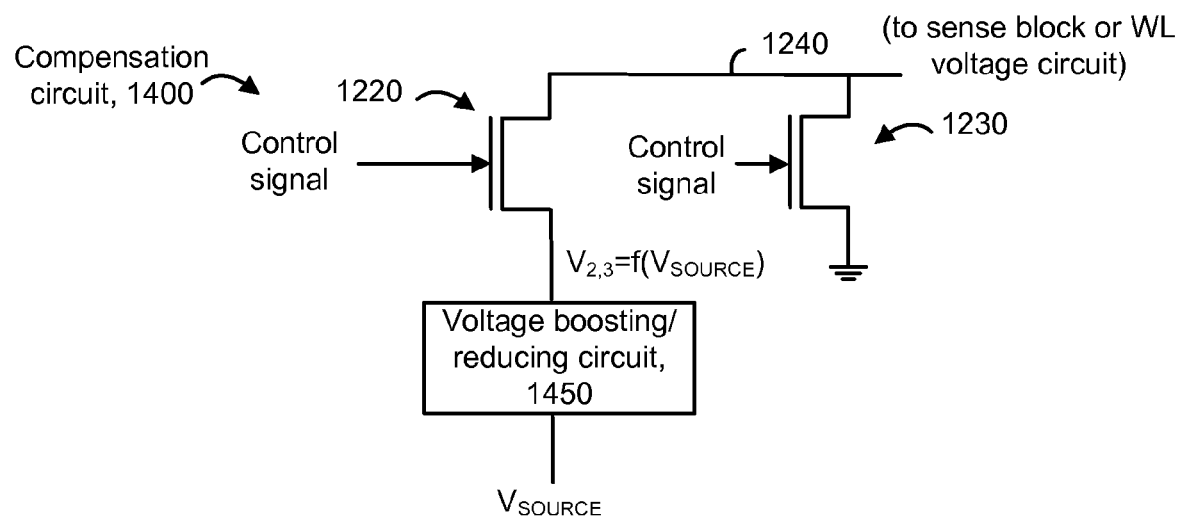
FIG. 14 depicts a compensation circuit which couples an output line to an output of a voltage boosting/reducing circuit or to ground.

FIG. 14 depicts a compensation circuit which couples an output line to an output of a voltage boosting/reducing circuit or to ground. Like-numbered elements correspond to those in FIG. 12. The compensation circuit 1400 includes switches such as n-MOS transistors 1220 and 1230. Additionally, a voltage boosting/reducing circuit 1450 is provided which can boost or reduce $V_{SOURCE}$, the voltage level of an input, thereby providing an output at a level of $V_2$ or $V_3$, which are compensating voltages for a control gate or drain/bit line, respectively, or one of more storage elements. The voltage boosting/reducing circuit 1450 receives the potential of the source as an input and provides an output whose potential is higher or lower than the potential of the source. $V_2$ or $V_3$ are thus provided as a function of $V_{SOURCE}$. If compensation is provided to both the control gate and the drain/bit line, a common compensation circuit can be used to provide both $V_2$ and $V_3$ at the same level or separate compensation circuits can be used to provide $V_2$ and $V_3$ at different levels.

In a first mode, such as during a read or verify operation, the transistor 1230 is turned off and the transistor 1220 is turned on, to pass $V_2$ or $V_3$ to the output line 1240 which, in turn, is coupled to the sense blocks and/or WL voltage circuits. In a second mode, such as during programming, erase-verify or sensing negative $V_{TH}$, the transistor 1230 is turned on and the transistor 1220 is turned off to couple the output line 1240 and the sense blocks and/or WL voltage circuits to ground. Appropriate control signals can be provided to control the transistors, e.g., by the bias/compensation control of FIG. 15.

FIG. 15 is a block diagram of a non-volatile memory system using single row/column decoders and read/write circuits. The diagram depicts a memory device 1596 having read/write circuits for reading and programming a page of storage elements in parallel. Memory device 1596 may include one or more memory die. One example of a memory die or chip 1598 includes a two-dimensional array of storage elements 900, control circuitry 1510, and read/write circuits 1565. In some embodiments, the array of storage elements can be three dimensional. The memory array 900 is addressable by word lines via a row decoder 1530 and by bit lines via a column decoder 1560. The read/write circuits 1565 include multiple sense blocks 1500 and allow a page of storage elements to be read or programmed in parallel. Typically a controller 1550 is included in the same memory device 1596 (e.g., a removable storage card) as the one or more memory die 1598. Commands and Data are transferred between the host and controller 1550 via lines 1520 and between the controller and the one or more memory die 1598 via lines 1518.

The control circuitry 1510 cooperates with the read/write circuits 1565 to perform operations on the memory array 900. The control circuitry 1510 includes a state machine 1512, an on-chip address decoder 1514, a bias/compensation control circuit 1515, and a power control module 1516. The bias/compensation control circuit 1515 provides control signals for controlling the bias/erase circuits and the compensation circuits of FIGS. 9a-14. The state machine 1512 provides chip-level control of memory operations. The on-chip address decoder 1514 provides an address interface between that used by the host or a memory controller to the hardware address used by the decoders 1530 and 1560. The power control module 1516 controls the power and voltages supplied to the word lines and bit lines during memory operations.

In some implementations, some of the components of FIG. 15 can be combined. In various designs, one or more of the components (alone or in combination), other than storage element array 900, can be thought of as a managing or control circuit. For example, one or more managing or control circuits may include any one of or a combination of control circuitry 1510, state machine 1512, decoders 1514/1560, power control 1516, sense blocks 1500, read/write circuits 1565, controller 1550, etc.

Figure 16:
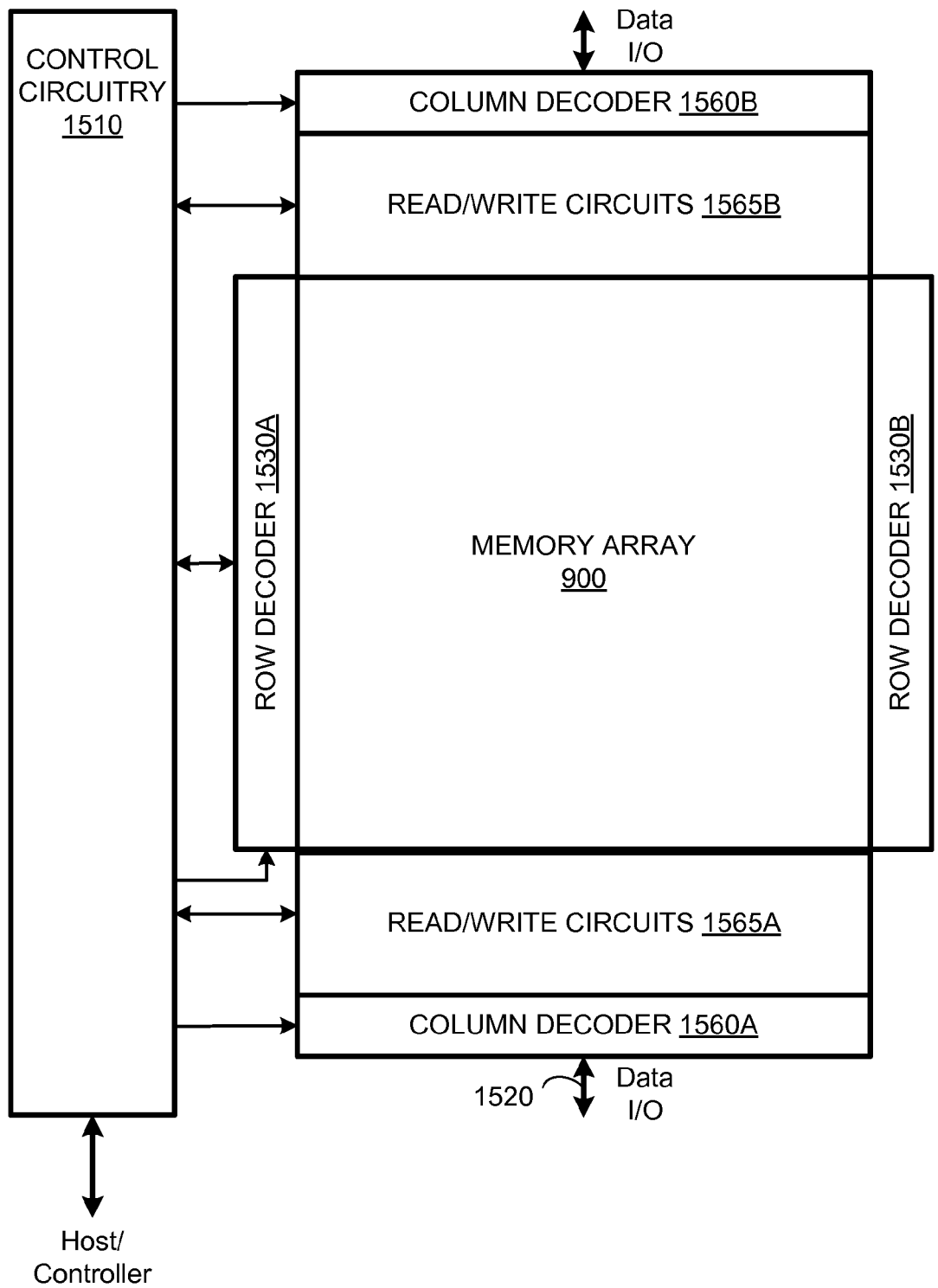
FIG. 16 is a block diagram of a non-volatile memory system using dual row/column decoders and read/write circuits.

FIG. 16 is a block diagram of a non-volatile memory system using dual row/column decoders and read/write circuits. Here, another arrangement of a memory device is provided. Access to the memory array 900 by the various peripheral circuits is implemented in a symmetric fashion, on opposite sides of the array, so that the densities of access lines and circuitry on each side are reduced by half. Thus, the row decoder is split into row decoders 1530A and 1530B and the column decoder into column decoders 1560A and 1560B. Similarly, the read/write circuits are split into read/write circuits 1565A connecting to bit lines from the bottom and read/write circuits 1565B connecting to bit lines from the top of the array 900. In this way, the density of the read/write modules is essentially reduced by one half. The device can also include a controller, as described above for the device of FIG. 15.

Figure 17:
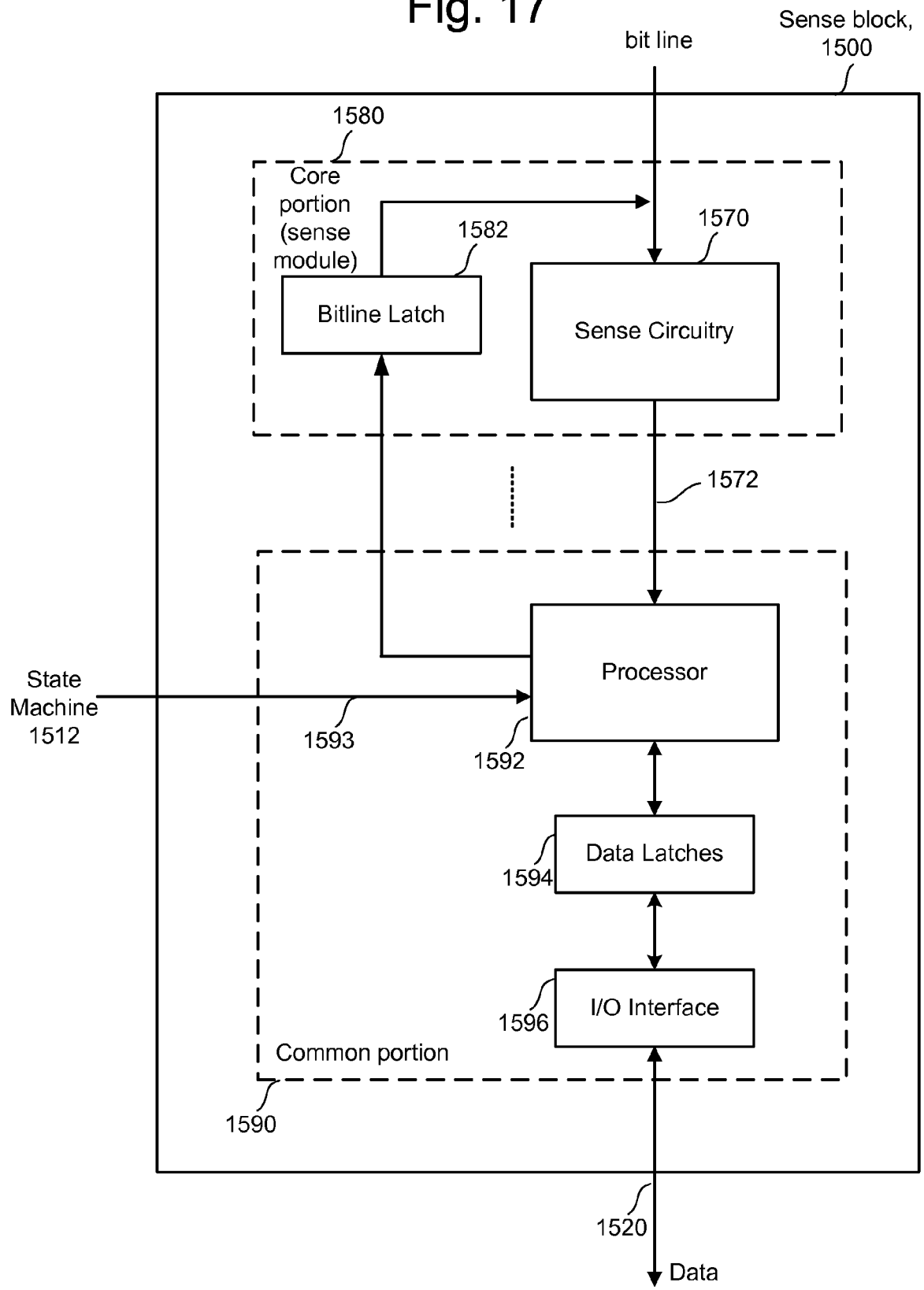
FIG. 17 is a block diagram depicting one embodiment of a sense block.

FIG. 17 is a block diagram depicting one embodiment of the sense block 1500 of FIG. 15. A sense block is used to determine the programming condition of a non-volatile storage element. An individual sense block 1500 is partitioned into a core portion, referred to as a sense module 1580, and a common portion 1590. In one embodiment, there will be a separate sense module 1580 for each bit line and one common portion 1590 for a set of multiple sense modules 1580. In one example, a sense block will include one common portion 1590 and eight sense modules 1580. Each of the sense modules in a group will communicate with the associated common portion via a data bus 1572. For further details refer to U.S. Patent Application Pub No. 2006/0140007, titled "Non-Volatile Memory & Method with Shared Processing for an Aggregate of Sense Amplifiers" published Jun. 29, 2006, and incorporated herein by reference in its entirety.

Sense module 1580 comprises sense circuitry 1570 that determines whether a conduction current in a connected bit line is above or below a predetermined threshold level. Sense module 1580 also includes a bit line latch 1582 that is used to set a voltage condition on the connected bit line. For example, a predetermined state latched in bit line latch 1582 will result in the connected bit line being pulled to a state designating program inhibit (e.g., Vdd). Note that the bit line latch 1582 that is used to set $V_{BL}$ can be referenced to a voltage which is a function of $V_{SOURCE}$, as discussed. The bit line latch can be provided in sense blocks 910-912 in FIGS. 9-11, for instance.

Common portion 1590 comprises a processor 1592, a set of data latches 1594 and an I/O Interface 1596 coupled between the set of data latches 1594 and data bus 1520. Processor 1592 performs computations. For example, one of its functions is to determine the data stored in the sensed storage element and store the determined data in the set of data latches. The set of data latches 1594 is used to store data bits determined by processor 1592 during a read operation. It is also used to store data bits imported from the data bus 1520 during a program operation. The imported data bits represent write data meant to be programmed into the memory. I/O interface 1596 provides an interface between data latches 1594 and the data bus 1520.

During read or sensing, the operation of the system is under the control of state machine 1512 that controls the supply of different control gate voltages to the addressed storage element. As it steps through the various predefined control gate voltages corresponding to the various memory states supported by the memory, the sense module 1580 may trip at one of these voltages and an output will be provided from sense module 1580 to processor 1592 via bus 1572. At that point, processor 1592 determines the resultant memory state by consideration of the tripping event(s) of the sense module and the information about the applied control gate voltage from the state machine via input lines 1593. It then computes a binary encoding for the memory state and stores the resultant data bits into data latches 1594. In another embodiment of the core portion, bit line latch 1582 serves double duty, both as a latch for latching the output of the sense module 1580 and also as a bit line latch as described above.

It is anticipated that some implementations will include multiple processors 1592. In one embodiment, each processor 1592 will include an output line (not depicted in FIG. 17) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 1592 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 1594 from the data bus 1520. The program operation, under the control of the state machine, comprises a series of programming voltage pulses applied to the control gates of the addressed storage elements. Each programming pulse is followed by a read back (verify) to determine if the storage element has been programmed to the desired memory state. Processor 1592 monitors the read back memory state relative to the desired memory state. When the two are in agreement, the processor 1592 sets the bit line latch 1582 so as to cause the bit line to be pulled to a state designating program inhibit. This inhibits the storage element coupled to the bit line from further programming even if programming pulses appear on its control gate. In other embodiments the processor initially loads the bit line latch 1582 and the sense circuitry sets it to an inhibit value during the verify process.

Data latch stack 1594 contains a stack of data latches corresponding to the sense module. In one embodiment, there are three data latches per sense module 1580. In some implementations (but not required), the data latches are implemented as a shift register so that the parallel data stored therein is converted to serial data for data bus 1520, and vice versa. In the preferred embodiment, all the data latches corresponding to the read/write block of m storage elements can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) U.S. Patent App. Pub. No. 2004/0057287, "Non-Volatile Memory And Method With Reduced Source Line Bias Errors," published on Mar. 25, 2004; (2) U.S. Patent App. Pub. No. 2004/0109357, "Non-Volatile Memory And Method with Improved Sensing," published on Jun. 10, 2004; (3) U.S. Patent App. Pub No. 2005/0169082, titled "Memory Sensing Circuit And Method For Low Voltage Operation," published on Aug. 4, 2005; (4) U.S. Patent App. Pub. No. 2006/0221692, titled "Compensating for Coupling During Read Operations on Non-Volatile Memory," published on Oct. 5, 2006; and (5) U.S. Patent App. Pub. No. 2006/0158947, titled "Reference Sense Amplifier For Non-Volatile Memory, published on Jul. 20, 2006. All five of the immediately above-listed patent documents are incorporated herein by reference in their entirety.

Figure 18:
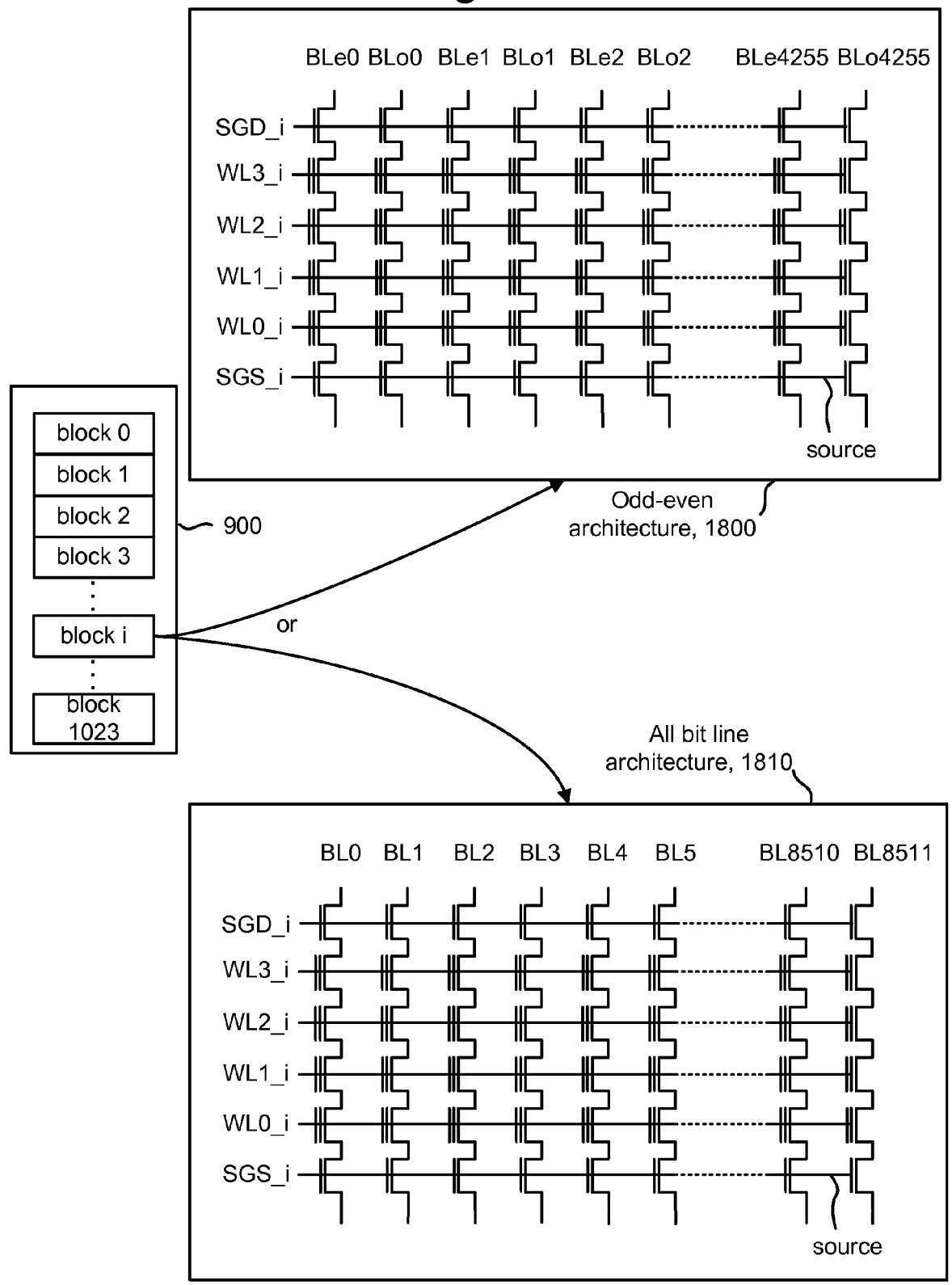
FIG. 18 depicts an example of an organization of a memory array into blocks for odd-even and all bit line memory architectures.

FIG. 18 depicts an example of an organization of a memory array into blocks for odd-even and all bit line memory architectures. Exemplary structures of the memory array 900 of FIG. 9a are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, ... BL8511. In one embodiment referred to as an all bit line (ABL) architecture (architecture 1810), all the bit lines of a block can be simultaneously selected during read and program operations. Storage elements along a common word line and connected to any bit line can be programmed at the same time.

In the example provided, four storage elements are connected in series to form a NAND string. Although four storage elements are shown to be included in each NAND string, more or less than four can be used (e.g., 16, 32, 64 or another number). One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture (architecture 1800), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. Data can be programmed into different blocks and read from different blocks concurrently. In each block, in this example, there are 8,512 columns that are divided into even columns and odd columns. In this example, four storage elements are shown connected in series to form a NAND string. Although four storage elements are shown to be included in each NAND string, more or fewer than four storage elements can be used.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5 to 4.5 V and the unselected word lines (e.g., WL0, WL1 and WL3, when WL2 is the selected word line) are raised to a read pass voltage, $V_{READ}$, (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V or at a non-zero bias as discussed herein. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

Figure 19:
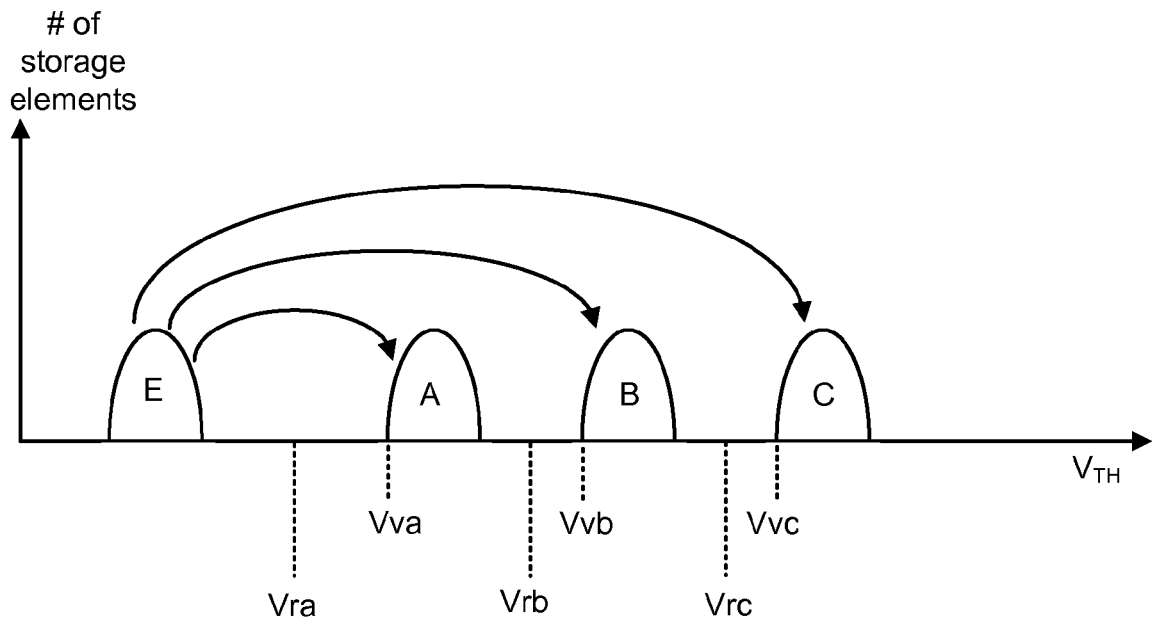
FIG. 19 depicts an example set of threshold voltage distributions.

FIG. 19 depicts an example set of threshold voltage distributions. Example $V_{TH}$ distributions for the storage element array are provided for a case where each storage element stores two bits of data. A first threshold voltage distribution E is provided for erased storage elements. Three threshold voltage distributions, A, B and C for programmed storage elements, are also depicted. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. For example, U.S. Pat. No. 6,222,762 and U.S. Patent App. Pub. No. 2004/0255090, published Dec. 16, 2004, both of which are incorporated herein by reference in their entirety, describe various data encoding schemes for multi-state flash storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the present invention can also be used with other multi-state structures including those that include more or less than four states.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

In one embodiment, known as full sequence programming, storage elements can be programmed from the erase state E directly to any of the programmed states A, B or C. For example, a population of storage elements to be programmed may first be erased so that all storage elements in the population are in erased state E. A series of programming pulses such as depicted by the pulse train of FIG. 23 will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn−1 is a maximized since the change in amount of charge on the floating gate under WLn is largest as compared to the change in voltage when programming from state E to state A or state E to state B. When programming from state E to state B the amount of coupling to the adjacent floating gate is reduced but still significant. When programming from state E to state A the amount of coupling is reduced even further. Consequently the amount of correction required to subsequently read each state of WLn−1 will vary depending on the state of the adjacent storage element on WLn.

Figure 20:
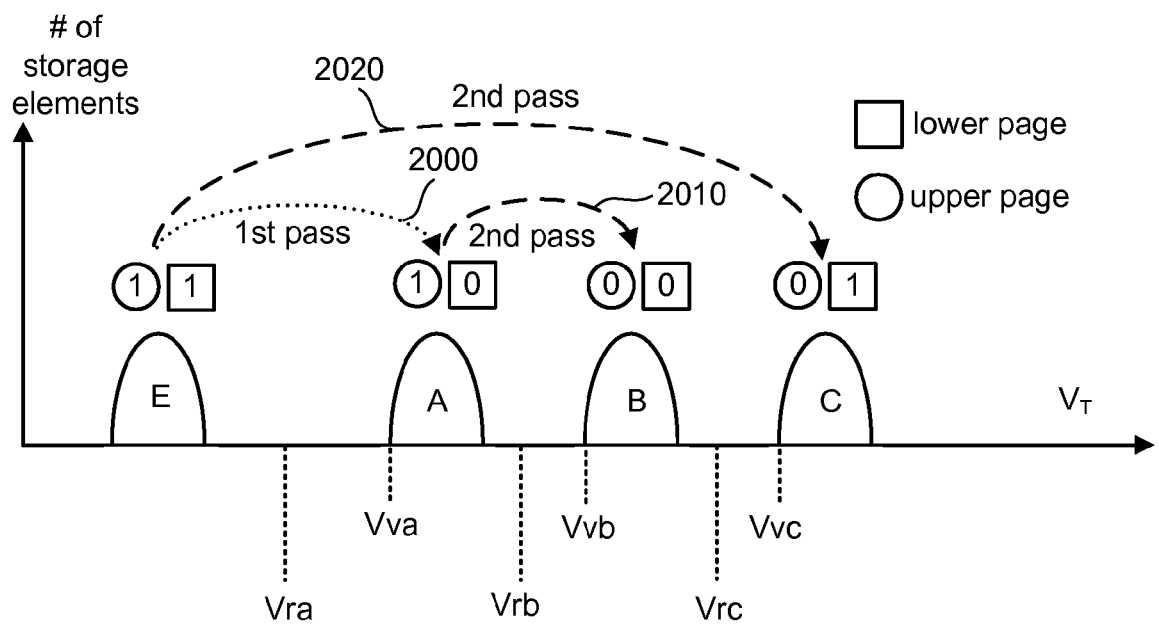
FIG. 20 depicts an example of a two-pass technique of programming a multi-state storage element that stores data for two different pages: a lower page and an upper page.

FIG. 20 depicts an example of a two-pass technique of programming a multi-state storage element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 2000. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 2020. If the storage element had been programmed into state A as a result of the first programming pass, then the storage element is further programmed in the second pass so that the threshold voltage is increased to be within state B, as depicted by arrow 2010. The result of the second pass is to program the storage element into the state designated to store a logic "0" for the upper page without changing the data for the lower page. In both FIG. 19 and FIG. 20 the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements. More details of such an embodiment are disclosed in U.S. Patent Application Pub. No. 2006/0126390, titled "Pipelined Programming of Non-Volatile Memories Using Early Data," published Jun. 15, 2006, incorporated herein by reference in its entirety.

Figure 21A:
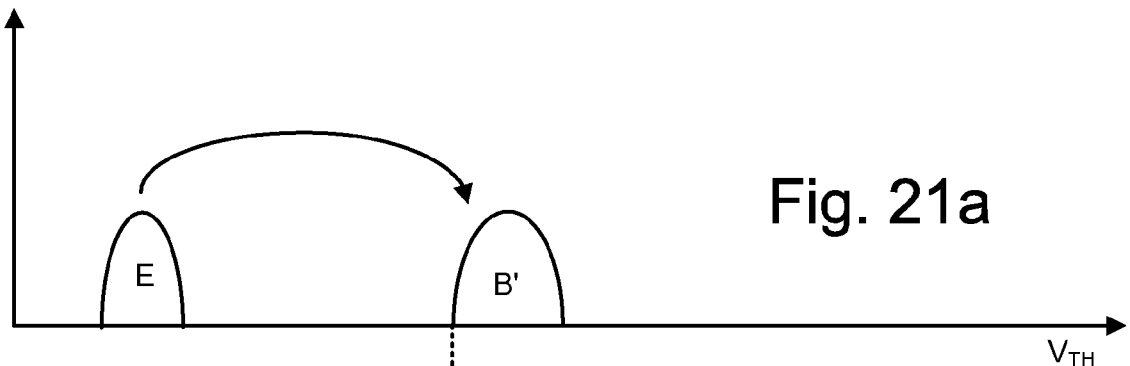
FIGS. 21a-c show various threshold voltage distributions and describe a process for programming non-volatile memory.
Figure 21B:
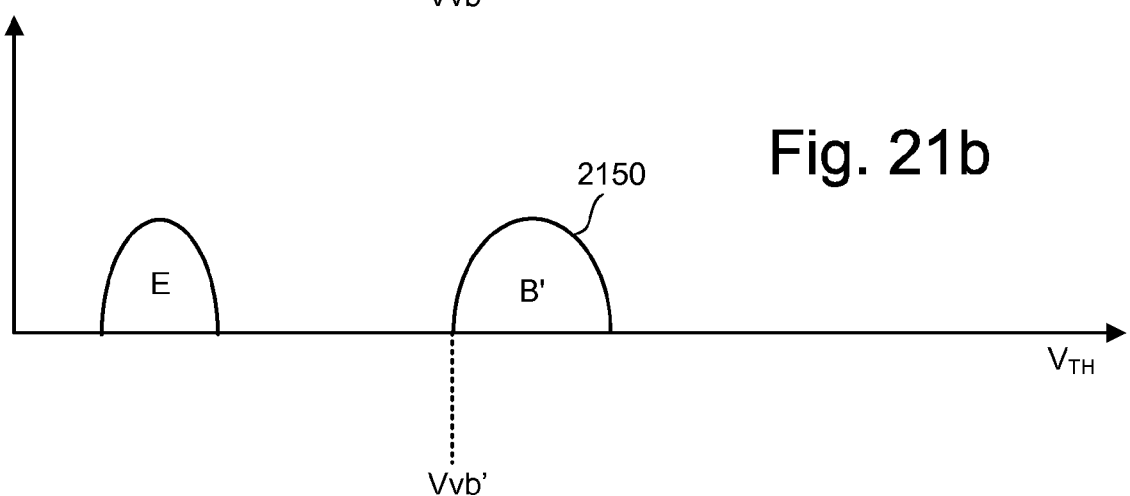
Figure 21C:
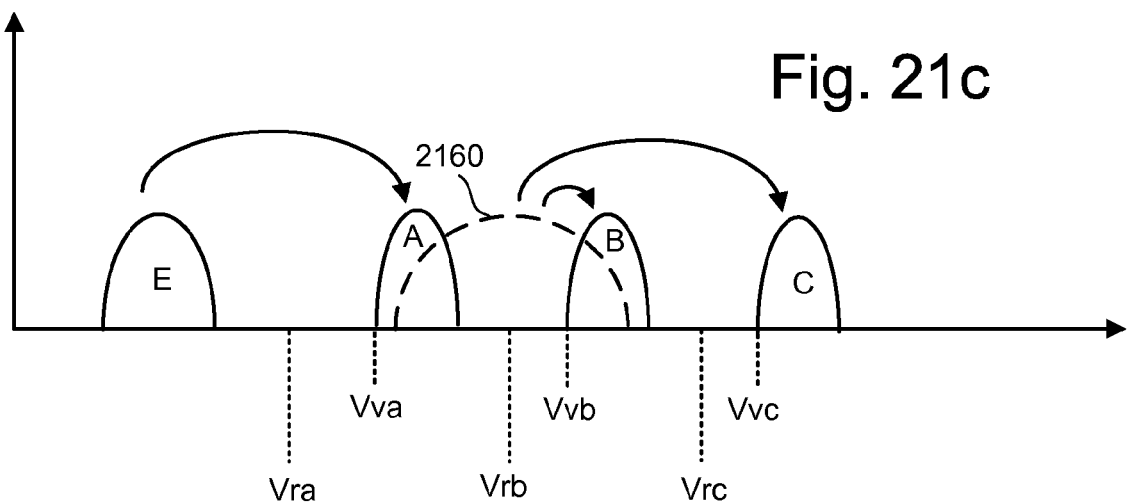

FIGS. 21*a-c* disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E. If the data is to be programmed to 0, then the threshold of voltage of the storage element is raised such that the storage element is programmed to state B'. FIG. 21*a* therefore shows the programming of storage elements from state E to state B'. State B' is an interim state B; therefore, the verify point is depicted as Vvb', which is lower than Vvb.

In one embodiment, after a storage element is programmed from state E to state B', its neighbor storage element (WLn+1) in the NAND string will then be programmed with respect to its lower page. For example, looking back at FIG. 2, after the lower page for storage element 106 is programmed, the lower page for storage element 104 would be programmed. After programming storage element 104, the floating gate to floating gate coupling effect will raise the apparent threshold voltage of storage element 106 if storage element 104 had a threshold voltage raised from state E to state B'. This will have the effect of widening the threshold voltage distribution for state B' to that depicted as threshold voltage distribution 2150 of FIG. 21b. This apparent widening of the threshold voltage distribution will be remedied when programming the upper page.

FIG. 21c depicts the process of programming the upper page. If the storage element is in erased state E and the upper page is to remain at 1, then the storage element will remain in state E. If the storage element is in state E and its upper page data is to be programmed to 0, then the threshold voltage of the storage element will be raised so that the storage element is in state A. If the storage element was in intermediate threshold voltage distribution 2160, which is widened relative to distribution 2150, and the upper page data is to remain at 1, then the storage element will be programmed to final state B. If the storage element is in intermediate threshold voltage distribution 2160 and the upper page data is to become data 0, then the threshold voltage of the storage element will be raised so that the storage element is in state C. The process depicted by FIGS. 21a-c reduces the effect of floating gate to floating gate coupling because only the upper page programming of neighbor storage elements will have an effect on the apparent threshold voltage of a given storage element. An example of an alternate state coding is to move from distribution 2160 to state C when the upper page data is a 1, and to move to state B when the upper page data is a 0.

Although FIGS. 21a-c provide an example with respect to four data states and two pages of data, the concepts taught can be applied to other implementations with more or fewer than four states and different than two pages.

Figure 22:
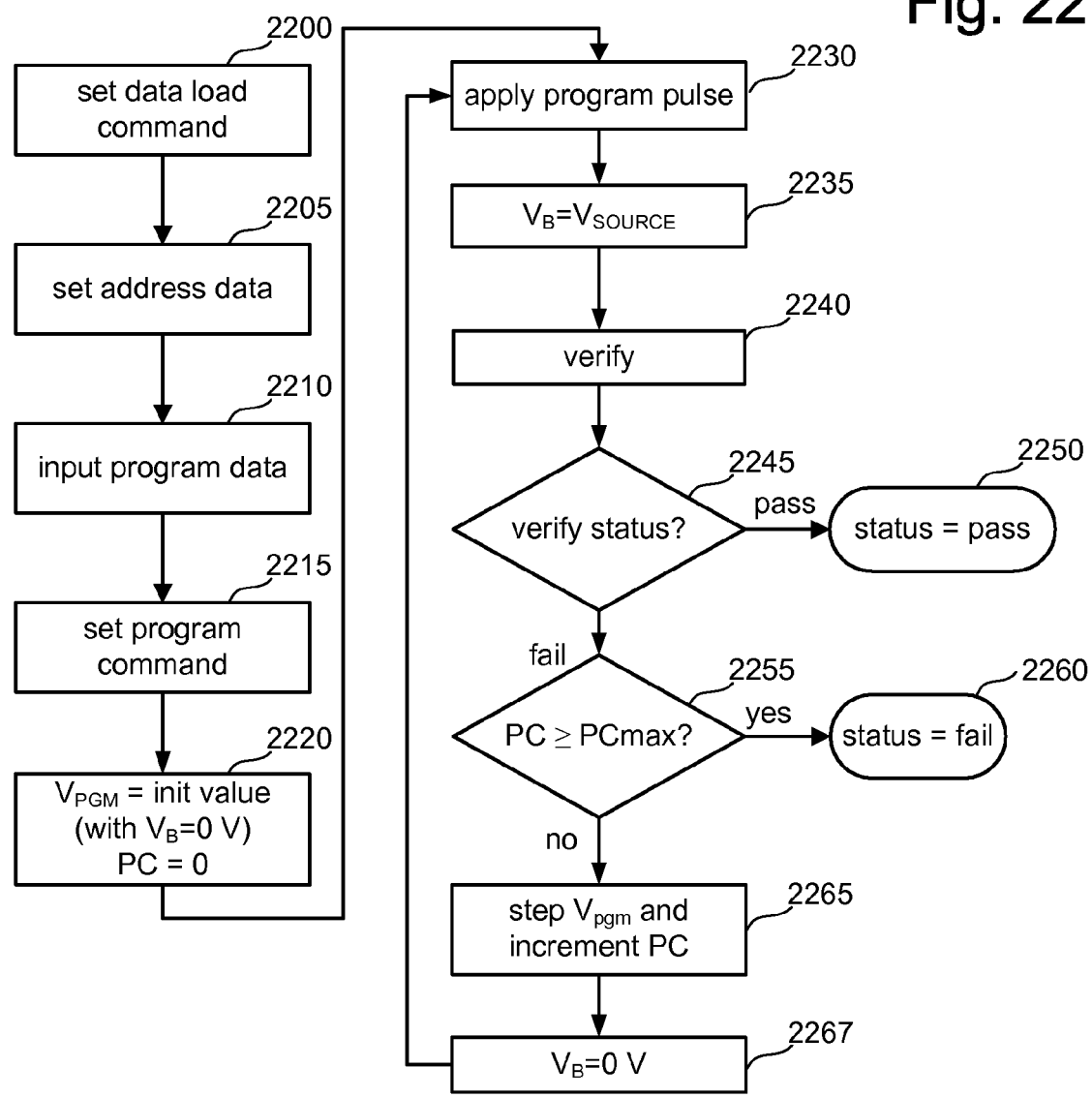
FIG. 22 is a flow chart describing one embodiment of a method for programming non-volatile memory.

FIG. 22 is a flow chart describing one embodiment of a method for programming non-volatile memory. In one implementation, storage elements are erased (in blocks or other units) prior to programming. In step 2200, a "data load" command is issued by the controller and input received by control circuitry 1510. In step 2205, address data designating the page address is input to decoder 1514 from the controller or host. In step 2210, a page of program data for the addressed page is input to a data buffer for programming. That data is latched in the appropriate set of latches. In step 2215, a "program" command is issued by the controller to state machine 1512.

Figure 23:
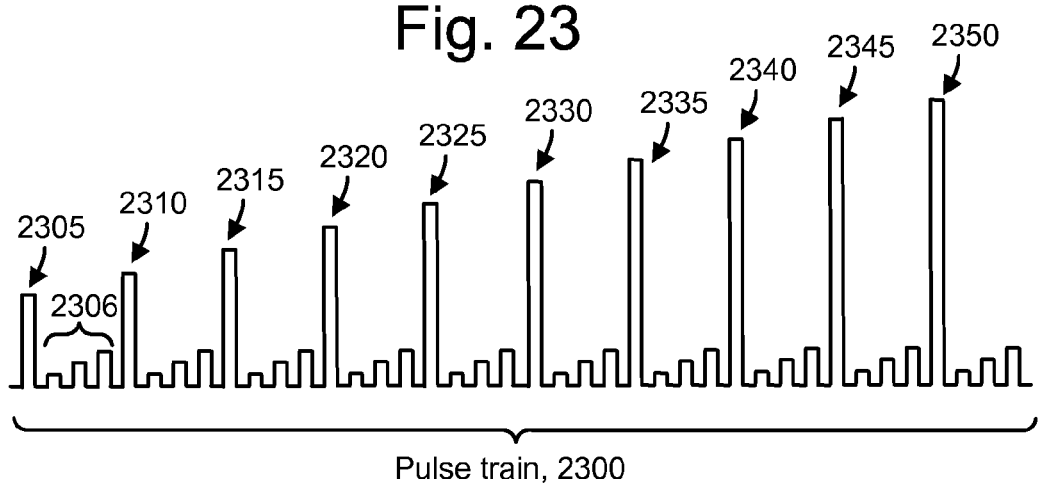
FIG. 23 depicts an example pulse train applied to the control gates of non-volatile storage elements during programming.

Triggered by the "program" command, the data latched in step 2210 will be programmed into the selected storage elements controlled by state machine 1512 using the stepped program pulses 2305, 2310, 2315, 2320, 2325, 2330, 2335, 2340, 2345, 2350, . . . of the pulse train 2300 of FIG. 23 applied to the appropriate selected word line. In step 2220, the program voltage, $V_{PGM}$, is initialized (with $V_B$=0 V, e.g., $V_{PGM}$ is referenced to ground) to the starting pulse (e.g., 12 V or other value) and a program counter (PC) maintained by state machine 1512 is initialized at zero. In step 2230, the first $V_{PGM}$ pulse is applied to the selected word line to begin programming storage elements associated with the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to Vdd to inhibit programming.

In step 2235, $V_B$ is set to $V_{SOURCE}$, or to a voltage which is a function of $V_{SOURCE}$, in one possible approach. In step 2240, the states of the selected storage elements are verified. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected storage elements have been programmed. In step 2245 (verify status), a check is made as to whether all of the data latches are storing logic "1." If all of the data latches are storing logic "1," the programming process is complete and successful because all selected storage elements were programmed and verified. A status of "PASS" is reported in step 2250.

If, in step 2245, it is determined that not all of the data latches are storing logic "1," then the programming process continues. In step 2255, the program counter PC is checked against a program limit value PCmax. One example of a program limit value is twenty; however, other numbers can also be used. If the program counter PC is not less than PCmax, then the program process has failed and a status of "FAIL" is reported in step 2260. If the program counter PC is less than PCmax, then $V_{PGM}$ is increased by the step size and the program counter PC is incremented in step 2265. In step 2267, the body bias $V_B$ is set to 0V, and the process loops back to step 2225 to apply the next $V_{PGM}$ pulse.

FIG. 23 depicts an example pulse train 2300 applied to the control gates of non-volatile storage elements during programming. The pulse train 2300 includes a series of program pulses 2305, 2310, 2315, 2320, 2325, 2330, 2335, 2340, 2345, 2350, . . . , that are applied to a word line selected for programming. In one embodiment, the programming pulses have a voltage, $V_{PGM}$, which starts at 12 V and increases by increments, e.g., 0.5 V, for each successive programming pulse until a maximum of 20 V is reached. In between the program pulses are verify pulses. For example, verify pulse set 2306 includes three verify pulses. In some embodiments, there can be a verify pulse for each state that data is being programmed into, e.g., state A, B and C. In other embodiments, there can be more or fewer verify pulses. The verify pulses in each set can have amplitudes of Vva, Vvb and Vvc (FIG. 20) or Vvb' (FIG. 21a), for instance.

Figure 24:
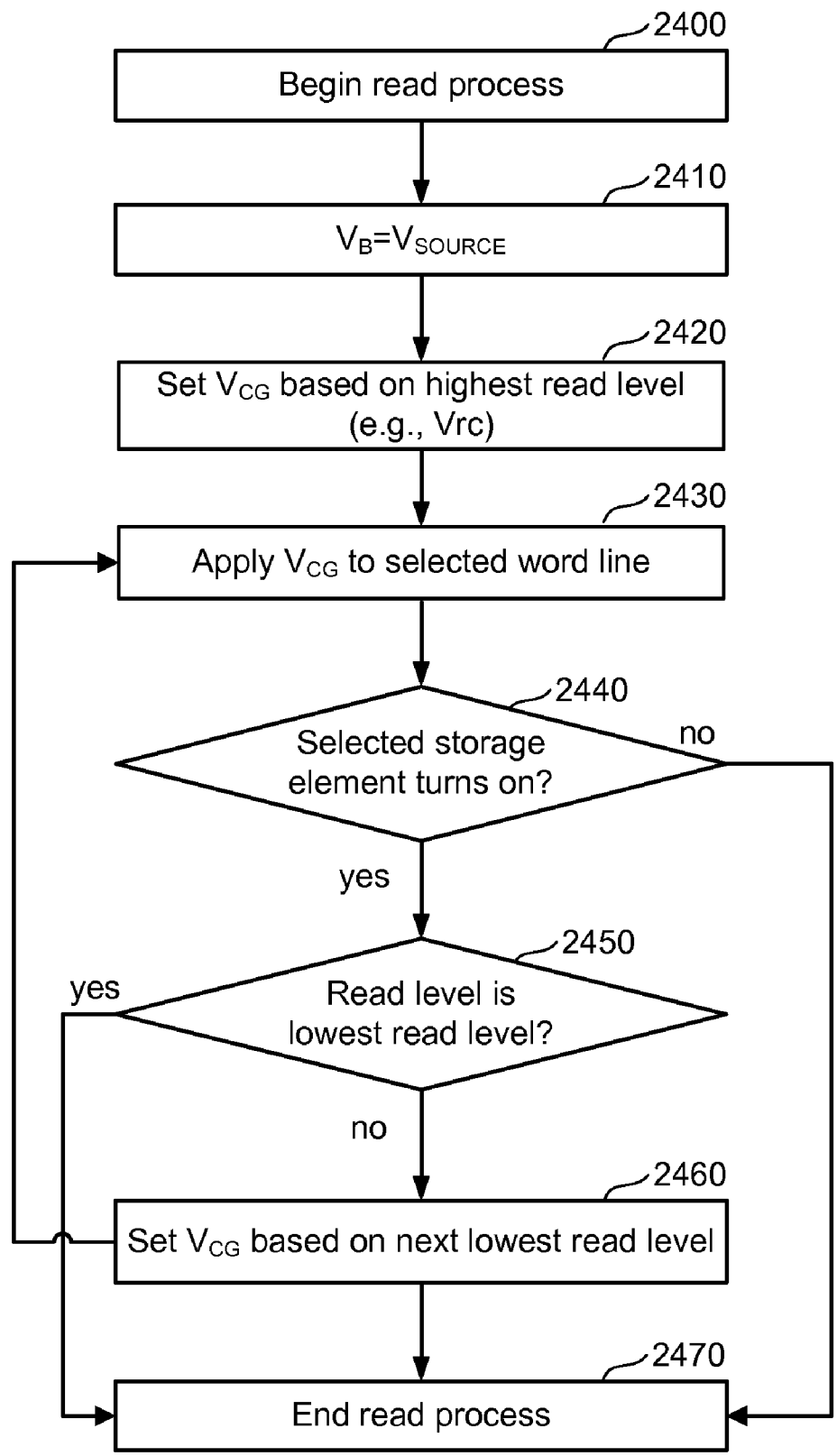
FIG. 24 is a flow chart describing one embodiment of a process for reading a non-volatile memory.

FIG. 24 is a flow chart describing one embodiment of a process for reading a non-volatile memory. The read process begins at step 2400 and can include a number of read cycles, one for each read state. In step 2410, $V_B$ is set to $V_{SOURCE}$, or to a voltage which is a function of $V_{SOURCE}$, in one possible approach. In a first read cycle, step 2420 includes setting $V_{CG}$ based on the highest read level, e.g., Vrc (see FIG. 19). Step 2430 includes applying $V_{CG}$ to the selected word line. At decision block 2440, if the selected storage element does not turn on, it can be concluded that it is in state C, in which case the read process ends at step 2460. If the selected storage element does turn on, it can be concluded that it is in a lower state than state C. At decision step 2450, it is determined that the read level (Vrc) is not the lowest read level. At step 2460, $V_{CG}$ is set based on the next lowest read level, e.g., Vrb, and processing continues at step 2430. In this second pass of decision block 2440, if the selected storage element does not turn on, it can be concluded that it is in state B, at which point the read process ends at step 2460. If the selected storage element does turn on, it can be concluded that it is in a lower state than state B. At decision step 2450, it is determined that the read level (Vrb) is not the lowest read level. At step 2460, $V_{CG}$ is set based on the next lowest read level, e.g., Vra, and processing continues at step 2430. In this third pass of decision block 2440, if the selected storage element does not turn on, it can be concluded that it is in state A, at which point the read process ends at step 2460. If the selected storage element does turn on, it can be concluded that it is in a lower state than state A, which is state E. At decision step 2450, it is determined that the read level (Vra) is the lowest read level, at which point the read process ends at step 2470. The example provided can be extended to include additional or fewer programming states.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating a non-volatile storage system, comprising:
   performing a first operation on at least one non-volatile storage element in a set of non-volatile storage elements, the first operation comprises at least one of a read operation and a verify operation, and the set of non-volatile storage elements is formed, at least in part, on a substrate; and
   during the first operation, biasing the substrate according to a first voltage which is based on a voltage of a source which is associated with the at least one non-volatile storage element.

2. The method of claim 1, wherein:
   the first voltage is obtained by increasing the voltage of the source.

3. The method of claim 1, wherein:
   the first voltage is obtained by reducing the voltage of the source.

4. The method of claim 1, wherein:
   the first voltage and the voltage of the source are the same.

5. The method of claim 1, wherein:
   the set of non-volatile storage elements is formed, at least in part, on a p-well in the substrate, and the biasing comprises biasing the p-well according to the first voltage during the first operation.

6. The method of claim 1, wherein:
   the set of non-volatile storage elements is arranged in a plurality of NAND strings, and the source comprises a common source line for the plurality of NAND strings.

7. The method of claim 1, wherein:
   the biasing comprises applying a forward body bias to the substrate, the forward body bias is compensated according to the first voltage.

8. A method for operating a non-volatile storage system, comprising:
   performing at least first and second operations on at least one non-volatile storage element in a set of non-volatile storage elements, the first operation comprises at least one of a read operation and a verify operation, and the set of non-volatile storage elements is formed, at least in part, on a substrate; and
   coupling the substrate to a source which is associated with the at least one non-volatile storage element during the first operation, and to a ground during the second operation.

9. The method of claim 8, wherein:
   the second operation comprises at least one of: (a) a program operation, (b) an erase-verify operation and (c) sensing a negative threshold voltage of the at least one non-volatile storage element.

10. The method of claim 8, wherein:
    the set of non-volatile storage elements is formed, at least in part, on a p-well in the substrate, and the p-well is coupled to the source during the first operation and to the ground during the second operation.

11. The method of claim 8, wherein:
    the set of non-volatile storage elements is arranged in a plurality of NAND strings, and the source comprises a common source line for the plurality of NAND strings.

12. A method for operating a non-volatile storage system, comprising:
    performing a first operation on at least one non-volatile storage element in a set of non-volatile storage elements, the first operation comprises at least one of a read operation and a verify operation; and
    during the first operation, compensating a potential applied to a control gate of the at least one non-volatile storage element, the compensating is based on, and is different than, a potential of a source which is associated with the at least one non-volatile storage element.

13. The method of claim 12, wherein:
    the set of non-volatile storage elements are associated with a plurality of word lines, and the potential applied to the control gate is applied via at least one of the word lines.

14. The method of claim 12, further comprising:
    receiving the potential of the source as an input and providing an output for use in the compensating whose potential is higher than the potential of the source.

15. The method of claim 12, further comprising:
    receiving the potential of the source as an input and providing an output for use in the compensating whose potential is lower than the potential of the source.

16. The method of claim 12, wherein:
    the set of non-volatile storage elements is arranged in a plurality of NAND strings, and the source comprises a common source line for the plurality of NAND strings.

17. The method of claim 12, wherein:
    a potential applied to the control gate is not compensated during a second operation which comprises at least one of: (a) a program operation, (b) an erase-verify operation and (c) sensing a negative threshold potential of the at least one non-volatile storage element.

18. A method for operating a non-volatile storage system, comprising:
    performing a first operation on at least one non-volatile storage element in a set of non-volatile storage elements, the first operation comprises at least one of a read operation and a verify operation; and
    during the first operation, compensating a potential applied to a drain which is associated with the at least one non-volatile storage element, the compensating is based on, and is different than, a potential of a source which is associated with the at least one non-volatile storage element.

19. The method of claim 18, wherein:
the set of non-volatile storage elements is arranged in a plurality of NAND strings associated with respective bit lines, and the potential applied to the drain is applied via at least one of the bit lines.

20. The method of claim 18, further comprising:
receiving the potential of the source as an input and providing an output for use in the compensating whose potential is higher than the potential of the source.

21. The method of claim 18, further comprising:
receiving the potential of the source as an input and providing an output for use in the compensating whose potential is lower than the potential of the source.

22. The method of claim 18, wherein:
the set of non-volatile storage elements is arranged in a plurality of NAND strings, and the source comprises a common source line for the plurality of NAND strings.

23. The method of claim 18, wherein:
a potential applied to the drain is not compensated during a second operation which comprises at least one of: (a) a program operation, (b) an erase-verify operation and (c) sensing a negative threshold potential of the at least one non-volatile storage element.

24. A method for operating a non-volatile storage system, comprising:
performing a first operation on at least one non-volatile storage element in a set of non-volatile storage elements, the set of non-volatile storage elements is formed, at least in part, on a substrate;
during the first operation, biasing the substrate according to a first voltage which is based on a voltage of a source which is associated with the at least one non-volatile storage element; and
coupling the substrate to a ground when a second operation is performed, the second operation comprises at least one of: (a) a program operation, (b) an erase-verify operation and (c) sensing a negative threshold voltage of the at least one non-volatile storage element.

* * * * *